United States Patent
Hauenstein

(10) Patent No.: US 8,680,666 B2
(45) Date of Patent: Mar. 25, 2014

(54) BOND WIRELESS POWER MODULE WITH DOUBLE-SIDED SINGLE DEVICE COOLING AND IMMERSION BATH COOLING

(75) Inventor: Henning M. Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 200 days.

(21) Appl. No.: 11/751,936

(22) Filed: May 22, 2007

(65) Prior Publication Data

US 2007/0290311 A1 Dec. 20, 2007

Related U.S. Application Data

(60) Provisional application No. 60/803,064, filed on May 24, 2006.

(51) Int. Cl.
*H01L 23/02* (2006.01)
*H01L 23/24* (2006.01)

(52) U.S. Cl.
USPC .......... 257/685; 257/712; 257/691; 257/707; 257/E25.001; 257/E23.001

(58) Field of Classification Search
USPC .......... 257/659, 686, 690, 700, 723, E23.001, 257/706, 718, 719, E23.101, E23.181, 257/E23.044, 666, 668, 678, 685, 687, 691, 257/693, 702, 707, 712, 717, 724, 734, 787, 257/E27.001, E25.001, E25.002, E25.012, 257/E25.022, E25.031, E23.008, E23.085; 361/704, 707, 715; 363/56.08
See application file for complete search history.

(56) References Cited

U.S. PATENT DOCUMENTS

| | | | | |
|---|---|---|---|---|
| 4,717,996 A * | 1/1988 | Bourke et al. | ............ | 363/56.08 |
| 4,855,809 A * | 8/1989 | Malhi et al. | ............ | 257/684 |
| 5,279,029 A * | 1/1994 | Burns | ............ | 29/856 |
| 5,574,314 A * | 11/1996 | Okada et al. | ............ | 257/728 |
| 5,661,339 A * | 8/1997 | Clayton | ............ | 257/678 |
| 5,684,675 A * | 11/1997 | Taniguchi et al. | ............ | 361/704 |
| 5,701,034 A * | 12/1997 | Marrs | ............ | 257/706 |
| 5,719,745 A * | 2/1998 | Agonafer et al. | ............ | 361/704 |
| 5,943,213 A * | 8/1999 | Sasov | ............ | 361/705 |
| 6,025,642 A * | 2/2000 | Burns | ............ | 257/686 |
| 6,188,575 B1 * | 2/2001 | Azotea | ............ | 361/701 |
| 6,219,240 B1 * | 4/2001 | Sasov | ............ | 361/704 |
| 7,208,829 B2 * | 4/2007 | Hauenstein et al. | ............ | 257/690 |
| 2004/0056346 A1 * | 3/2004 | Palm et al. | ............ | 257/706 |
| 2004/0222515 A1 | 11/2004 | Choi et al. | | |
| 2005/0030717 A1 | 2/2005 | Inagaki et al. | | |
| 2005/0167789 A1 * | 8/2005 | Zhuang | ............ | 257/659 |
| 2005/0205970 A1 * | 9/2005 | Chen et al. | ............ | 257/666 |
| 2005/0211998 A1 * | 9/2005 | Daniels et al. | ............ | 257/89 |

* cited by examiner

FOREIGN PATENT DOCUMENTS

| | | | |
|---|---|---|---|
| WO | WO 01/24260 | 4/2001 | |
| WO | WO 03/096415 | * 11/2003 | ............ 257/690 |

Primary Examiner — Cuong Q Nguyen
Assistant Examiner — Galina Yushina
(74) Attorney, Agent, or Firm — Farjami & Farjami LLP

(57) ABSTRACT

A wire bond free power module assembly consists of a plurality of individual thin packages each consisting of two DBC wafers which sandwich one or more semiconductor die. The die electrodes and terminals extend through one insulation covered end of the wafer sandwich and the outer sides of the sandwiches are the outer copper plates of the DBC wafers which are in good thermal communication with the semiconductor die but are electrically insulated therefrom. The plural packages may be connected in parallel by lead frames on the terminals and the packages are stacked with a space between them to expose both sides of all packages to a cooling medium, either the fingers of a conductive comb or a fluid heat exchange medium.

20 Claims, 31 Drawing Sheets

BOND WIRELESS POWER MODULE WITH DOUBLE-SIDED SINGLE DEVICE COOLING AND IMMERSION BATH COOLING

RELATED APPLICATIONS

This application claims the benefit of U.S. Provisional Application No. 60/803,064, filed May 24, 2006 entitled BOND WIRELESS POWER MODULE WITH DOUBLE-SIDED SINGLE DEVICE COOLING AND IMMERSION BATH COOLING the entire disclosure of which is incorporated by reference herein.

This application is also related to U.S. Provisional Application No. 60/747,952, filed May 23, 2007 entitled HIGHLY EFFICIENT BOTH-SIDE-COOLED DISCRETE POWER PACKAGE, ESPECIALLY BASIC ELEMENT FOR INNOVATIVE POWER MODULES; U.S. Ser. No. 11/641,270 filed Dec. 19, 2006 entitled PACKAGE FOR HIGH POWER DENSITY DEVICES; Provisional Application Ser. No. 60/756,984 filed Jan. 6, 2006 entitled BOND-WIRELESS POWER PACKAGE WITH INTEGRATED CURRENT SENSOR, ESPECIALLY SHORT CIRCUIT PROTECTION and Provisional Application Ser. No. 60/761,722 filed Jan. 24, 2006 entitled STRESS-REDUCED BOND-WIRELESS PACKAGE FOR HIGH POWER DENSITY DEVICES, the entire disclosures of which are incorporated by reference herein.

FIELD OF THE INVENTION

This invention relates to semiconductor power modules and more specifically relates to a novel assembly of plural semiconductor device packages which can be cooled from both sides and their assembly into power conversion circuits.

BACKGROUND OF THE INVENTION

This application is for a novel structure and process for the plural assemblies of semiconductor die which have parallel opposite metal surfaces which are in good thermal communication with the opposite surface of one or more semiconductor die sandwiched between two direct bonded copper (DBC) wafers and are electrically insulated from the die electrodes. Copending application Ser. No. 11/751,930, shows a single two sided package which can be advantageously cooled from each side.

It would be desirable to assemble a plurality of such packages to form complete power converter circuits in a small volume and useable in a hostile thermal and mechanical environment, for example, for automotive application. Thus, many circuits are desirable for such applications, for example, high voltage, high current half or full bridges with IGBTs or other MOSgated devices or co-packs connected in parallel. Single phase and multiphase circuits are often needed. It is further desired to be able to assemble such circuits and housing them for forced air or liquid cooling which still making convenient access to the device terminals.

BRIEF DESCRIPTION OF THE INVENTION

In accordance with the invention, a plurality of flat double-sided cooled packages with embedded or sandwiched insulated semiconductor die having terminals extending from at least one edge thereof are stacked in a parallel array with their terminals extending from a single perpendicular plane. A common support structure, for example, the cover of a coolant container body, receives the terminal end of the packages, the bodies of which may be suspended in a coolant chamber. Lead frame terminals over the top of the cover connects like terminals together and defines the desired circuit to be formed.

In one embodiment of the invention, a comb-shaped conductive assembly clip receives the individual packages side-by-side and/or in parallel arrangement and the flat comb "teeth" or fingers press against each package surface in good thermal communication therewith. The comb-shaped clip may then be immersed in a fluid (air or liquid) cooling chamber with the terminals of each package protruding from the top of the chamber. Conductive lead frame strips extend over the top surface of the terminals to connect together common terminals to a circuit node.

Alternatively, stacked heat sink supports can receive selective groups of packages and can be stacked together with suitable fasteners.

The assembly so made is easily accomplished and is a reliable high current, high voltage circuit which can be mounted to a motor housing or the like in an automotive or other application.

DETAILED DESCRIPTION OF THE PREFERRED EMBODIMENTS

Figure 1:
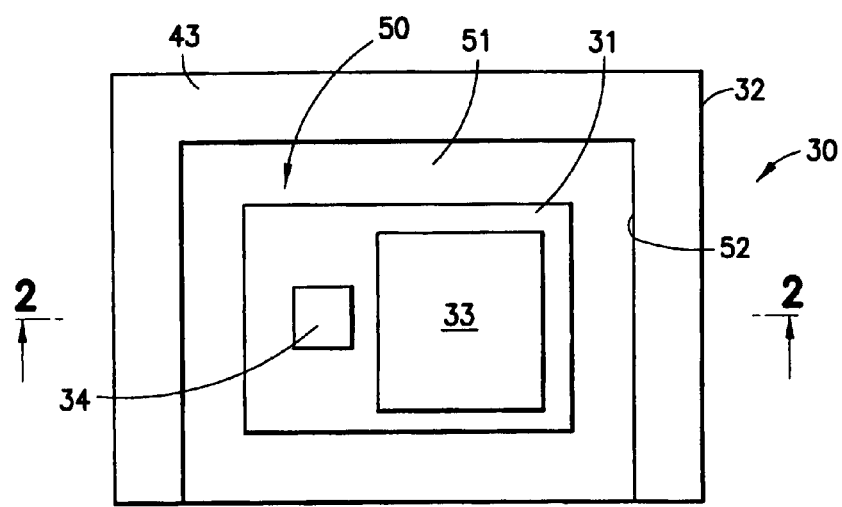
FIG. 1 is a top view of a package employing a single DBC wafer as disclosed in application Ser. No. 11/641,270.
Figure 2:
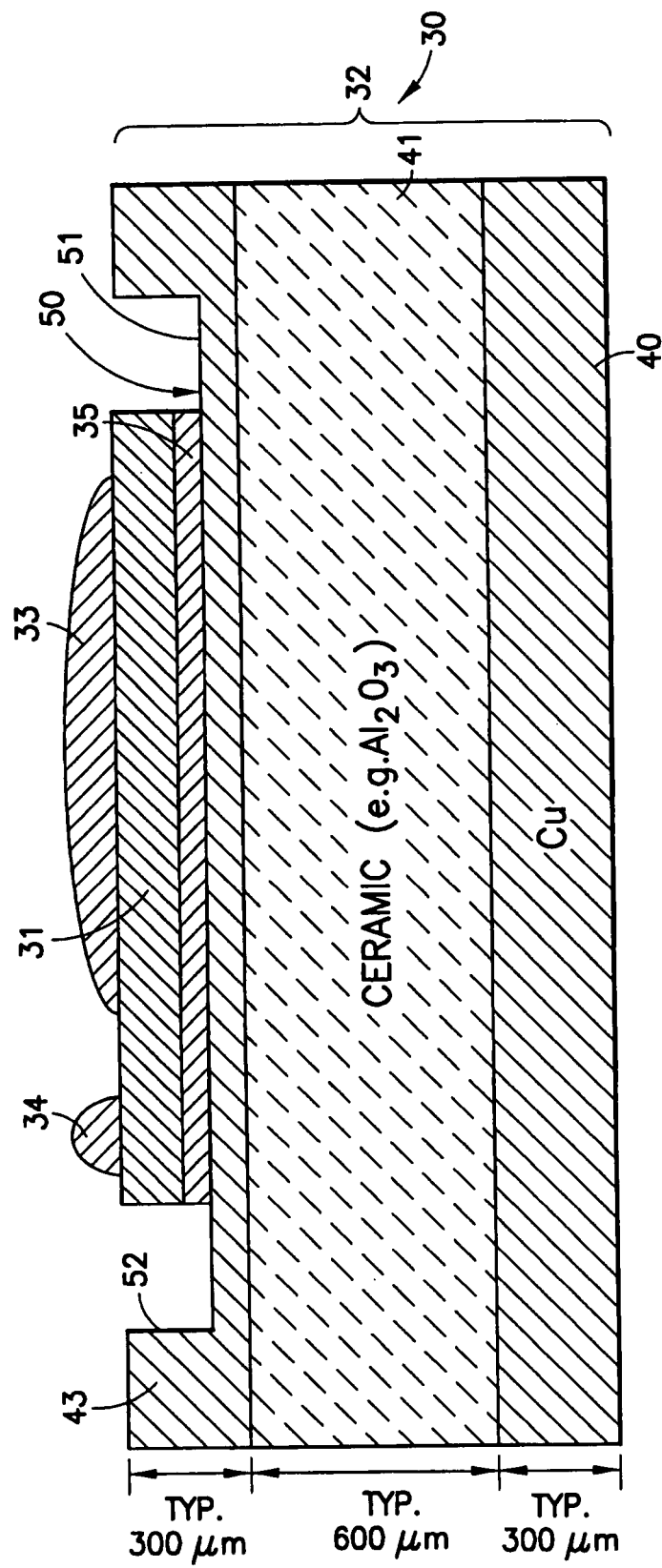
FIG. 2 is a cross-section of FIG. 1 taken across section line 2-2 in FIG. 1.
Figure 3:
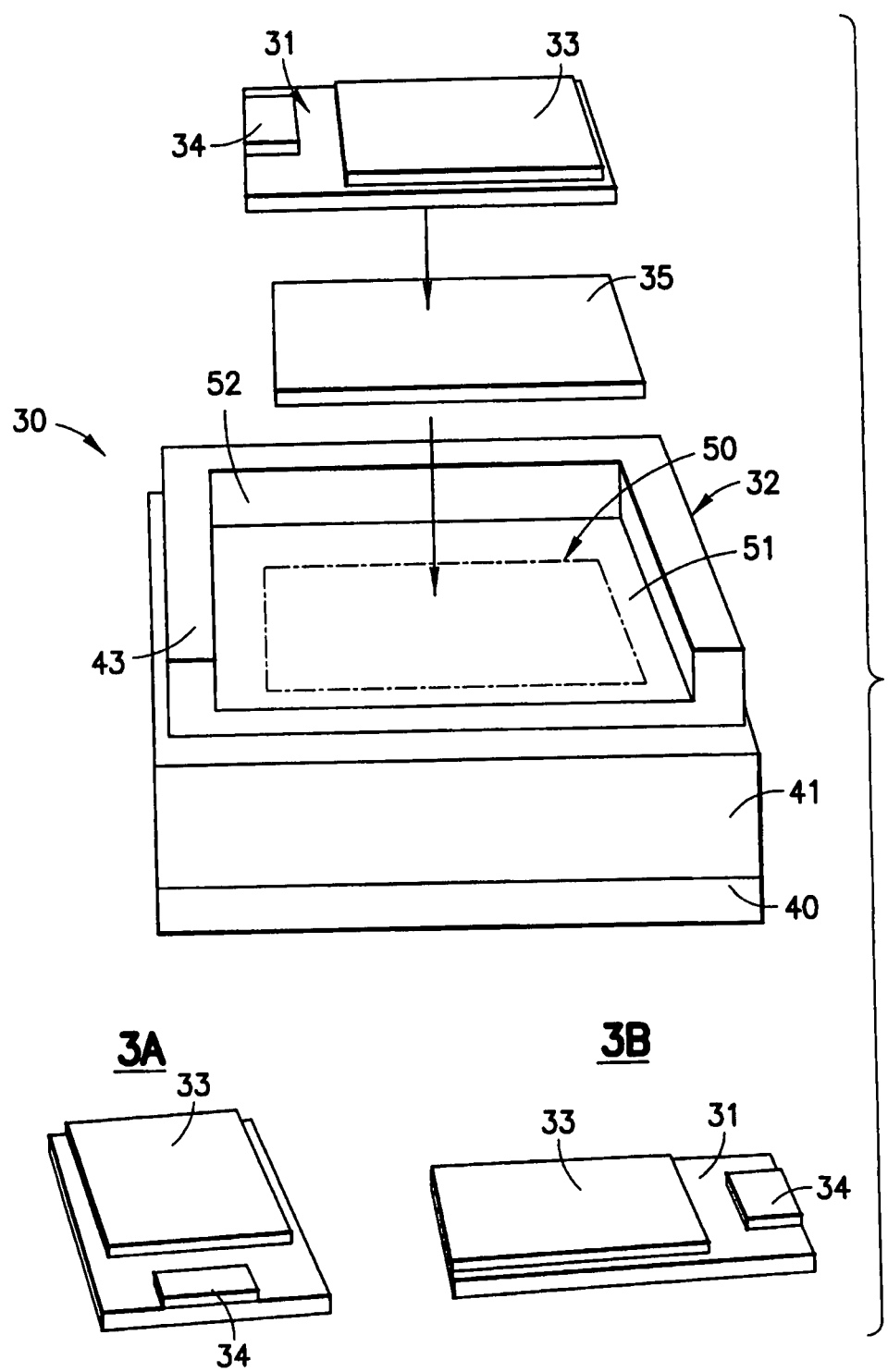
FIG. 3 is an exploded perspective view of FIGS. 1 and 2 and shows alternate orientations for the semiconductor die of the package.

FIGS. 1, 2 and 3 show a first embodiment of the semiconductor device 30 of copending application Ser. No. 11/641,270. The semiconductor device 30 comprises a semiconductor die 31 and a housing 32.

Semiconductor die 31 may be a silicon based vertical conduction power MOSFET having, on one surface, a source electrode which receives a solder bump 33, a gate electrode which receives a solder bump 34 and, on its opposite surface, a drain electrode which receives solder preform 35. Solderable metal pads can be used in place of the solder bumps and solder paste can be used in place of the solder preform. While die 31 is shown as a silicon die, it may be of any type of semiconductor material including Gallium Nitride, silicon carbide and the like. Further, while die 31 is described as a power MOSFET, it can be any type of semiconductor device, including a bipolar transistor die, an IGBT die, a break over device die, a diode die and the like. A copack of an IGBT and diode can be laterally spaced from one another and have their top and bottom electron inter-connected. The term MOSgated device is intended to refer to any type of semiconductor switching device with power electrodes on at least one surface thereof and a gate to switch the device between on and off conditions. The terms source electrode or source contact are intended to identify the source of a MOSFET or the emitter of an IGBT. Similarly, the terms drain electrode or contact and collector electrode or contact are intended to be interchangeably used.

The housing 32 may be a wafer consisting of a bottom conductive layer 40 which is bonded to an insulation layer 41 at its bottom surface, and a top conductive layer 43 which is bonded to the insulation layer at its top. This type of structure is referred to as "DBC". Top conductive layer 43 is patterned to have a depression 50 etched or otherwise formed therein and having a flat bottom surface 51 at least partly surrounded by a rim 52. The surfaces of depression 51 and rim 52 may, for example, be nickel plated to optimize solder wetting and to passivate the can against oxidation, and to increase reliability by changing the intermetallic between solder and the copper and the silicon or other material of the die to be soldered to surface 51.

The conductive materials used for layers 40 and 43 may be any high conductivity metal, such as, and preferably copper, although other metals can be used. The center layer 41 may be any good electrical insulation to insulate layers 40 and 43 from one another and could be a ceramic, preferably $Al_2O_3$. As further examples, AlN and SiN may also be used. The layers 40 and 43 may be of any desired thickness, typically 300 μm but can have any other desired thickness, typically between 300 to 600 μm. Such DBC materials are commercially available and are commonly used in semiconductor device modules where copper layers 40 and 43 are to be electrically insulated, but in thermal communication so heat generated in one layer can flow through the insulation barrier 41 to the other conductive layer.

The depression 51 will have a depth sufficient to receive solder layer 35 which typically may be less than about 100 μm thick and the die 31 which typically may be thinned to less than about 100 μm. In the example of FIG. 1, the die is 70 μm thick and the solder 35 is about 100 μm thick, leaving a web of copper 130 μm thick between surface 51 and the top surface of insulation layer 41.

Die 31 is appropriately soldered to the surface 50 of depression 50 with the top surface of die 31 at least approximately coplanar with the top of rim 52. Solder bumps 33 and 34 project above this plane so that the package can be inverted and the contact bumps soldered to traces on a circuit board without need for wire bonds. Alternatively, solderable pads can be used in place of the solder bumps for later solder attach. Heat generated at die 31 during its operation is conducted through ceramic 41 to the copper layer 40 which can dissipate heat from the package and, in particular, can be thermally connected to a heat sink which will be electrically insulated from the drain 35 and conductive layer 40.

While a relatively large gap is shown between the outer periphery of die 31 and the inner surface of rim 52, this space can be reduced to the smallest dimension consistent with manufacturing ease and convenience. Further, the remaining gap may be filled with an insulation bead.

FIG. 3 schematically shows two other examples of orientations for die 31 at locations 3A and 3B.

Figure 4:
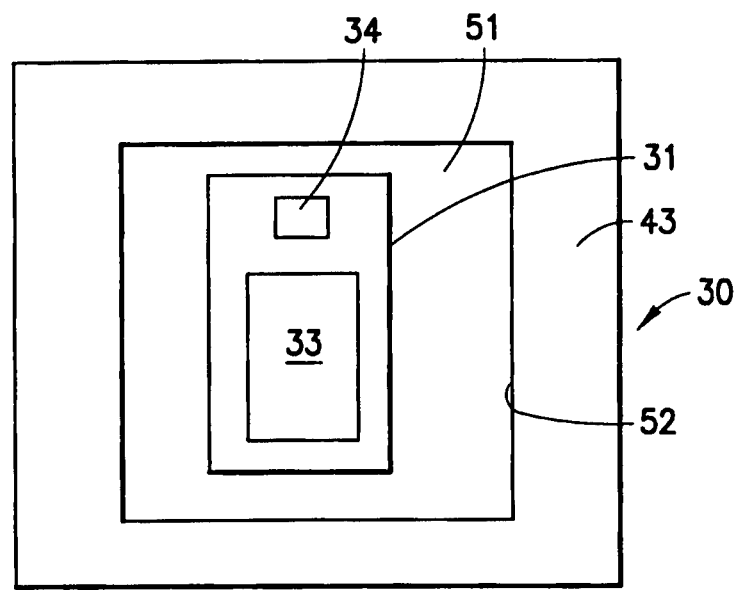
FIGS. 4 and 4A are a top views of alternative structures for the package.
Figure 4A:
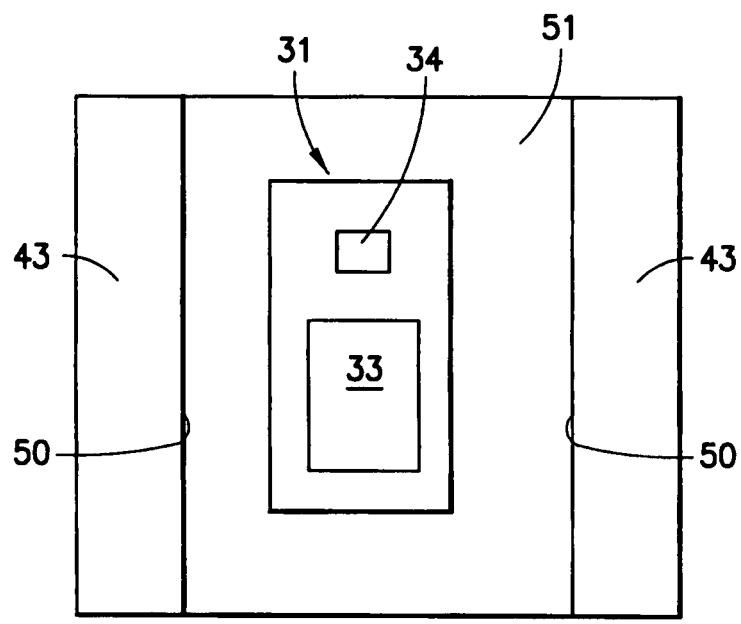

The rim 52 of copper layer 43 is shown to be a horse shoe or U-shape in FIGS. 1, 2 and 3. Other configurations can be used. For example, in FIG. 4, where components similar to those of FIGS. 1, 2 and 3 have the same identifying numerals, the depression 51 in layer 43 is completely enclosed by a rim 50. FIG. 4A shows another embodiment in which both ends of the rim 43 are removed or opened to simplify contact to the gate and source contacts 34 and 33 respectively. Further, in the embodiment of FIG. 4A, air inclusion is less likely to occur during molding or gel filling.

Figure 5:
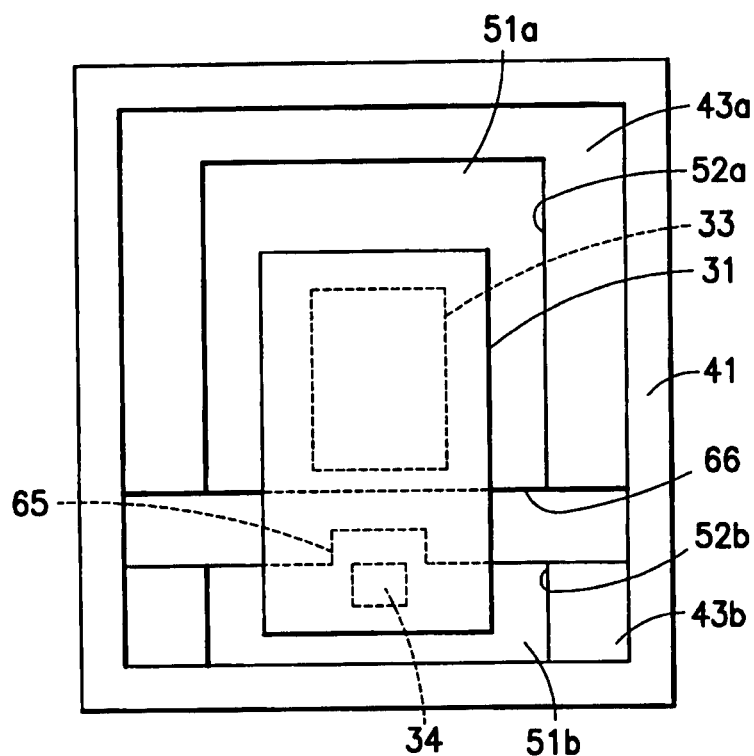
FIG. 5 is a top view of a further alternative of the package of FIGS. 1, 2 and 3 in which the die is inverted.
Figure 6:
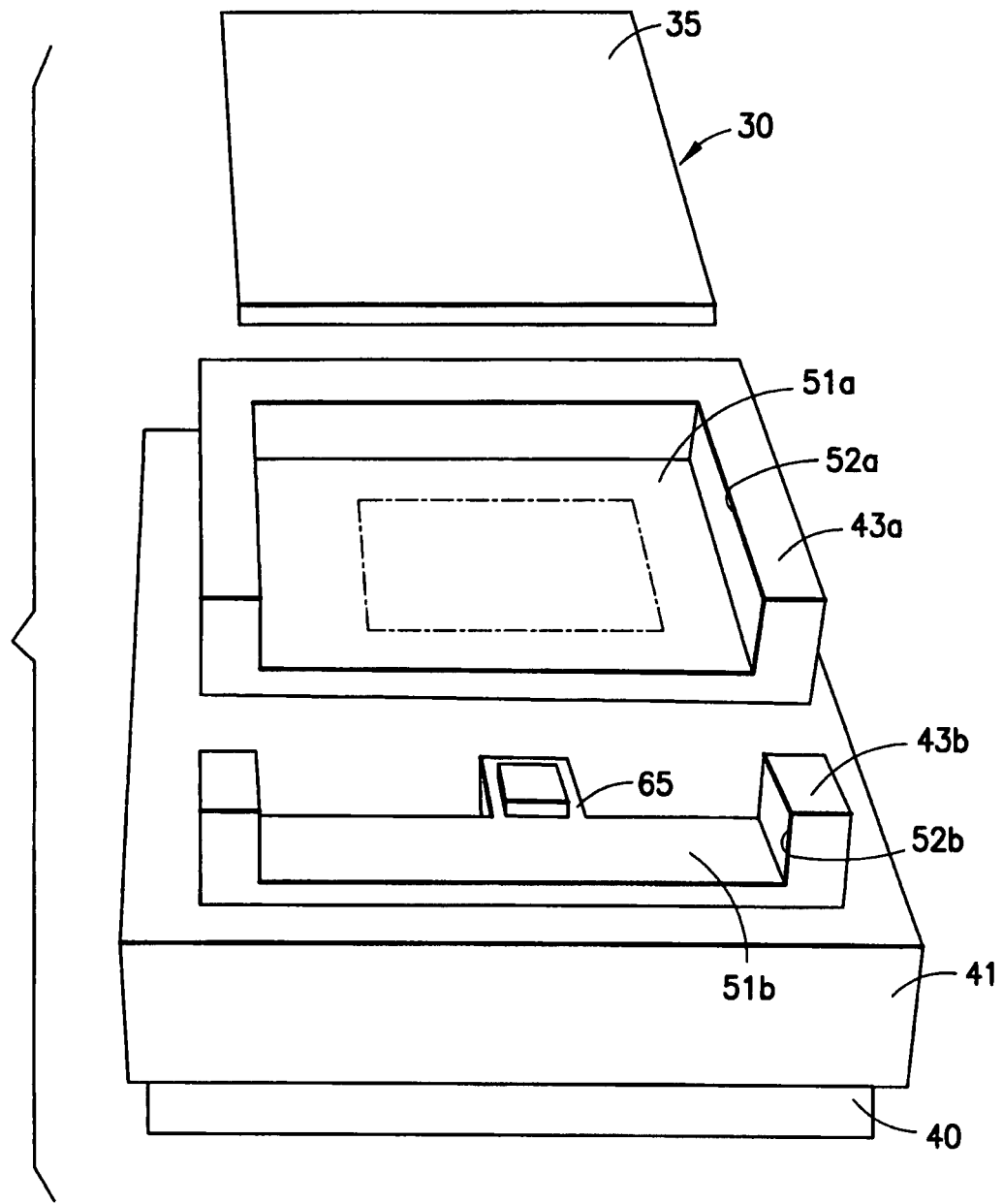
FIG. 6 is an exploded perspective view of the embodiment of FIG. 5.

FIGS. 5 and 6 show another embodiment and, as will be the case hereinafter with all drawings, the same number identifies similar components. FIGS. 5 and 6 show the die 31 of FIGS. 1 to 4 flipped over so that the source and gate bumps (or the equivalent bumps of an IGBT or the like) face the depressed flat surface 51. Thus, in FIGS. 5 and 6, the upper copper layer 43 of FIGS. 1 to 4 is separated into segments 43a and 43b with respective rim segments 52a and 52b and flat depression base portions 51a and 51b. A short tongue 65 extends from depression body 51b. The flipped die 31 may then be soldered with source bump 33 soldered to surface 51a and gate bump 34 soldered to surface 51b and insulted from source bump 33 by the gap 66 in top conductive layer 43a-43b.

Figure 7:
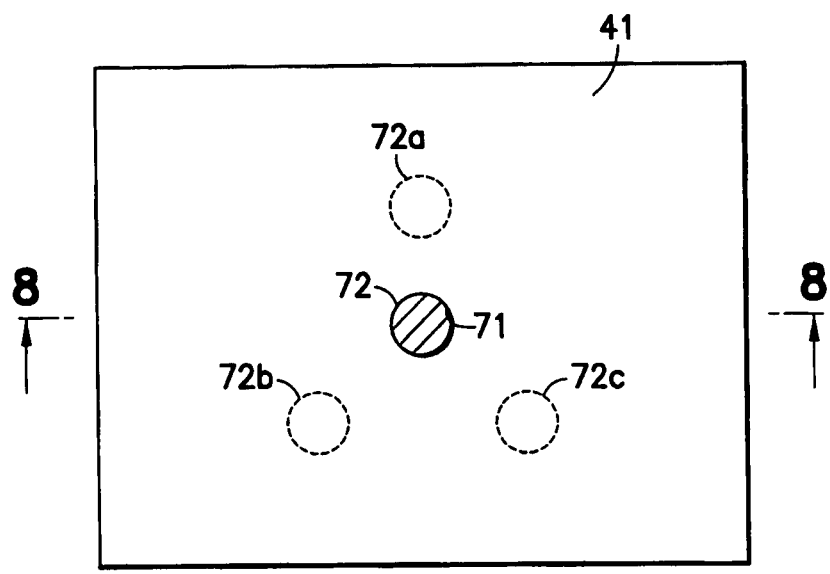
FIG. 7 is a top view of a further embodiment of the device of FIGS. 1 to 6 in which a resistive shunt via is formed in the DBC substrate.
Figure 8:
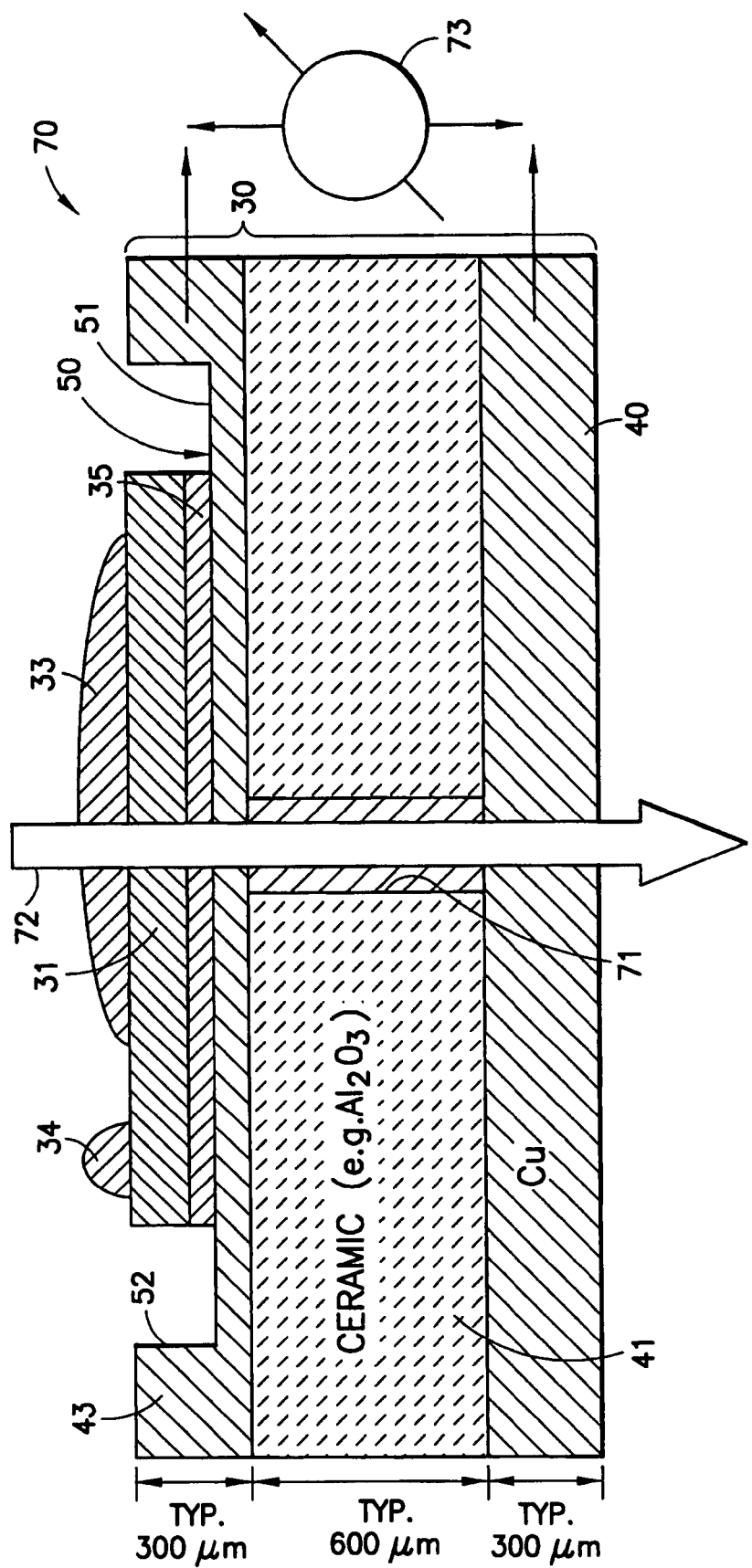
FIG. 8 is a cross-section of FIG. 7, taken across section line 8-8 in FIG. 7 and further shows a MOSFET die in the depression in the upper copper layer of the DBC wafer.

FIGS. 7 and 8 show a further embodiment in which at least one resistive current shunt is formed in package 70 (FIG. 8). Thus, the insulation layer 41 in FIG. 7 has a thru-opening 71 drilled or otherwise formed before copper layers 40 and 43 are bonded thereto. The thru-opening 71 can also be formed after the layers 40 and 43 are bonded to insulation 41. A suitable electrically conductive material 72 (FIG. 8) then fills the opening 71 to connect layers 40 and 43 and to form shunt resistor.

The required shunt resistance depends on the application and can be sized at greater than about desired 0.1 mohm although any resistance value can be created. The value of the shunt resistance will be a compromise between the acceptable power loss within the shunt and the voltage drop 73 across the shunt resistor 72. Note that the shunt 72 is integrated into the thermal path of the package 70 and will be automatically cooled by the heat sink or other thermal management cooling for the die 31.

The resistance of shunt 72 will depend on the geometry and length of thru hole 71 and the resistivity of the shunt material 72. The hole 71 is shown with a circular cross-section, but it could have any other shape. Its length will be that of the thickness of insulation layer, which, when a ceramic such as $Al_2O_3$ will be from 300 μm to 600 μm.

The material used for shunt 72 may be any desired conductor, for example, copper or solder, or may be materials such as manganin which have a relatively lower thermal coefficient of resistance. Plural parallel shunts equally or symmetrically distributed over the surface of the insulation layer 21 may also be used, shown in FIG. 7 by dotted circles 72a, 72b, 72c which will be under the relevant die electrode. This offers the advantage of lower inductance, higher shunt current and more equal shunt current distribution.

Figure 9:
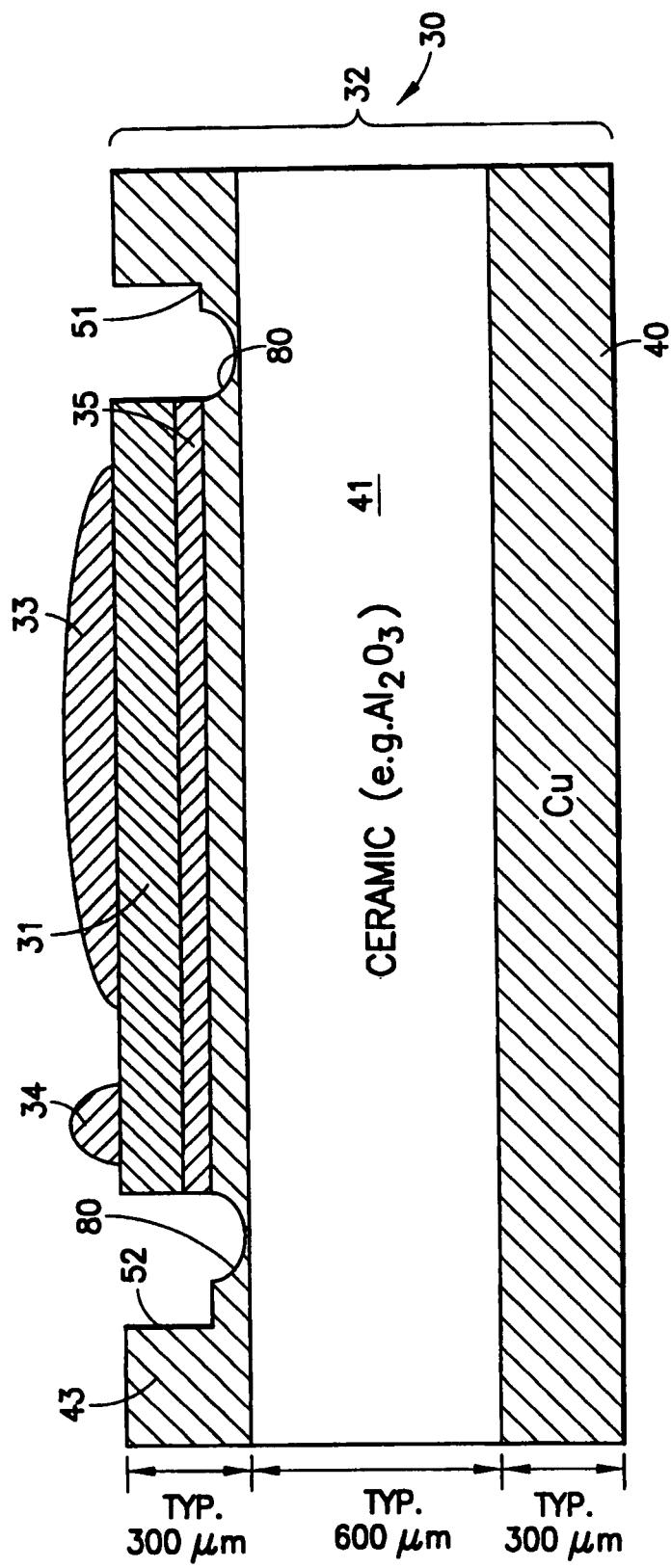
FIG. 9 is a cross section of a package, like that of FIG. 2, but further containing solder stop dimples to position the die during solder reflow.
Figure 10:
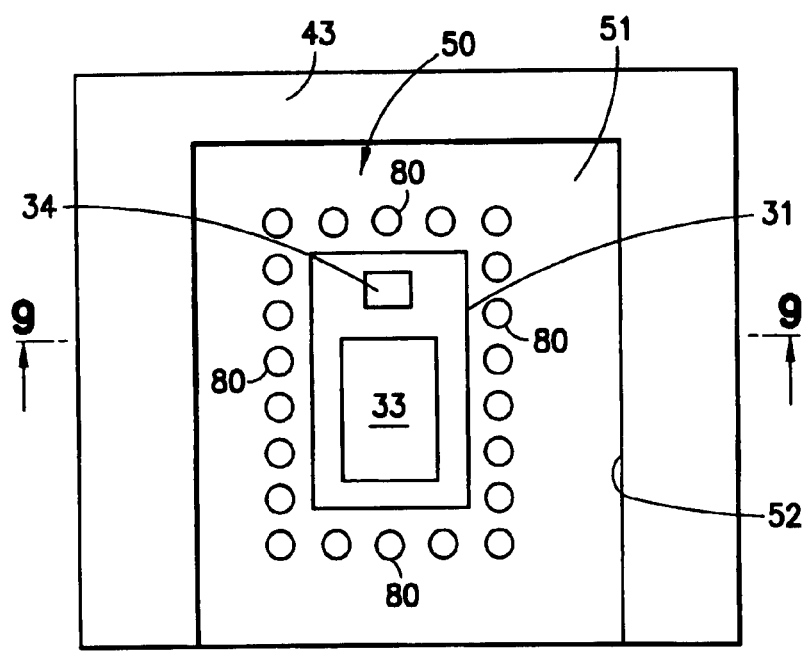
FIG. 10 is a top view of FIG. 9.
Figure 11:
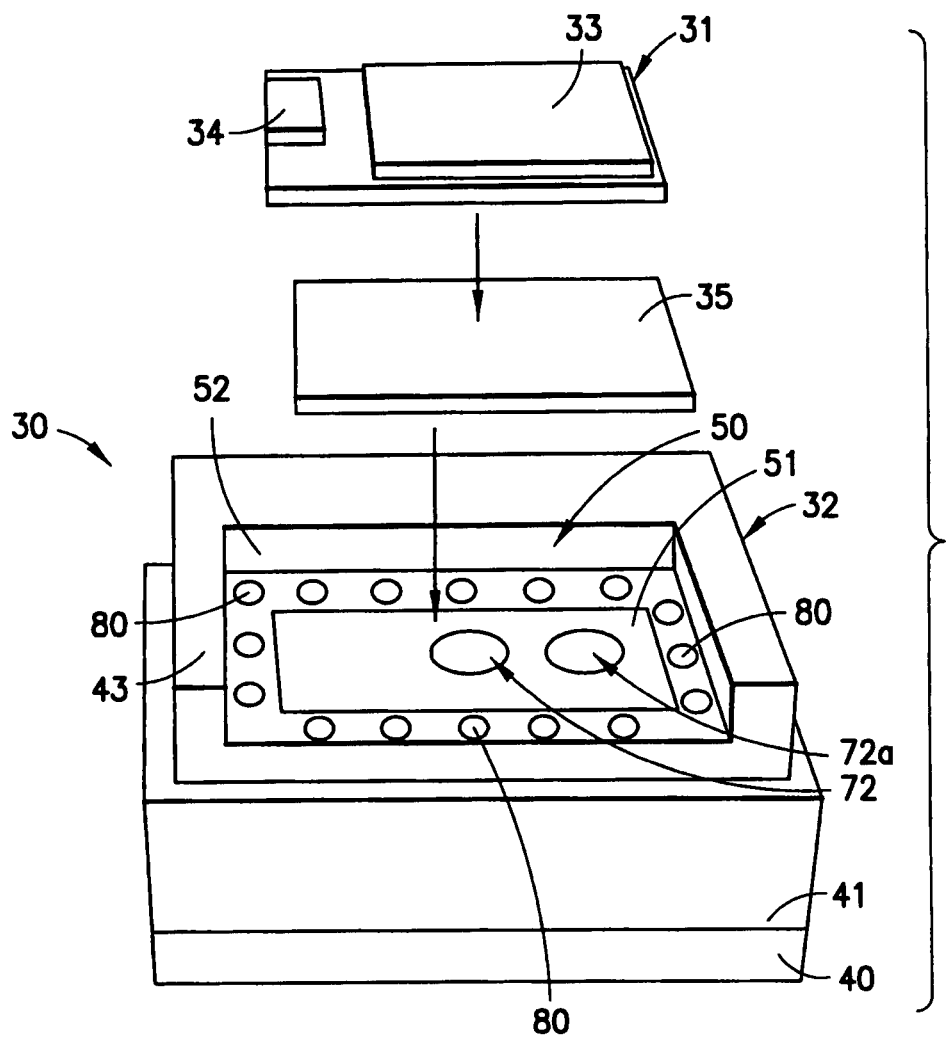
FIG. 11 is an exploded perspective of the package of FIG. 9 with plural resistive shunt vias in the DBC wafer.

Referring next to FIGS. 9, 10 and 11, there is shown a solder stop structure which securely locates the die 31 on surface 51 of device or package 70 of FIG. 8 during die attach and prevents the die edge from contacting the frame 52. Thus, a plurality of depressions or dimples 80 are formed around the desired location of die 31 to self-align the die during the die attach reflow process. Dimples 80 preferably have the rounded bottom shape reaching down to the ceramic 41.

It is also possible to use an isolating lacquer or other solder stop inside the frame 52. A "smooth solder" process may be used, using the preform 35 as shown rather than a solder paste with flux, which can also be used. When using the solder preform 35; the solder process can be carried out in forming gas atmosphere to avoid strong movement of the die inside the DBC can during the soldering process. However, dimples 80 will act as solder stops and also provide stress release inside the can for the bond force between the copper and the ceramic during temperature cycling.

In order to minimize package costs, the individual packages 70 of FIG. 8 (or 30 of FIG. 1) can be formed simultaneously on a DBC card and then singulated from the card.

Figure 12:
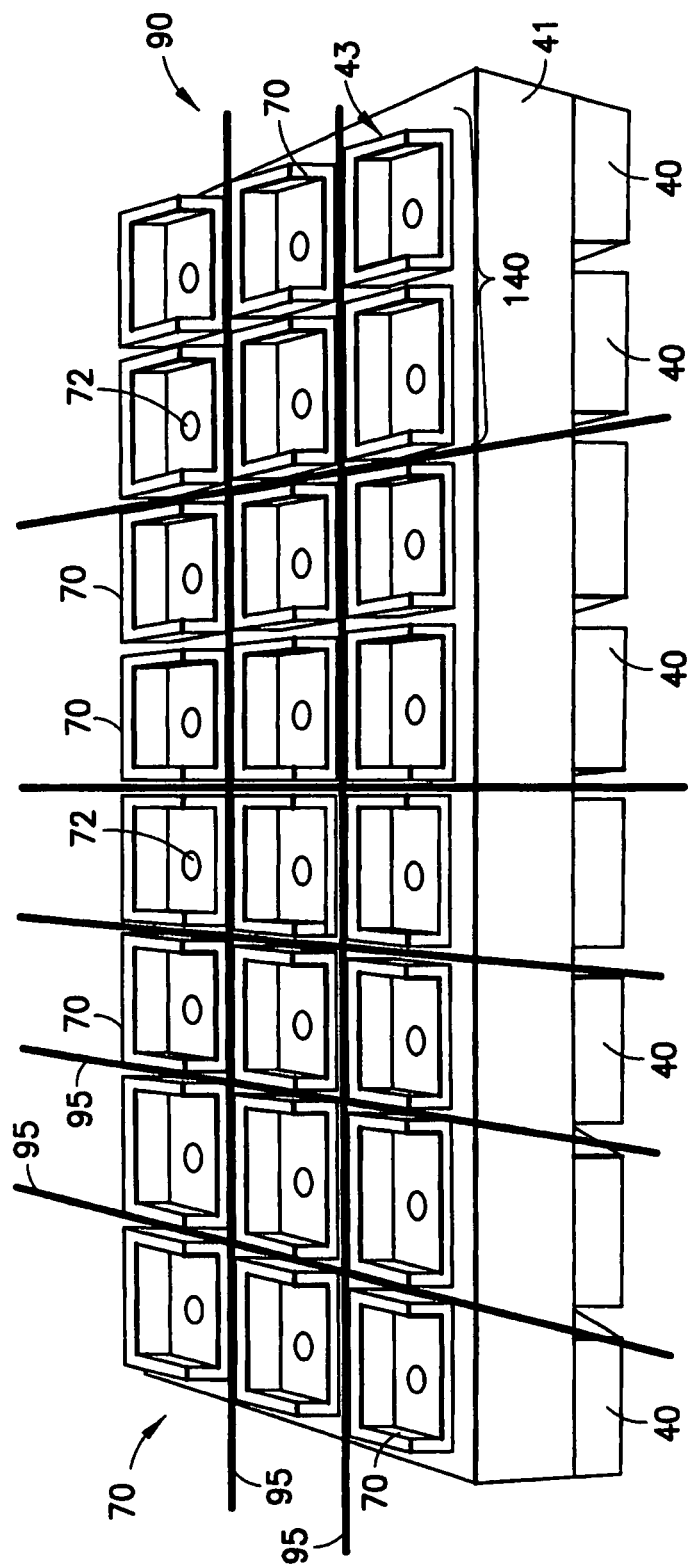
FIG. 12 shows a DBC card in which the packages of FIGS. 1 to 10 can be processed in wafer scale and can be singulated individually or in selected groups.

Thus, a DBC card 90 is shown in FIG. 12. Such cards are produced in sizes such as 5"×7" or 4"×6" and have a continuous central ceramic layer 41 with top and bottom copper layers. These layers can be simultaneously masked and etched to define the individual packages 70 (or 30) with the depressions 52 in the top layer as in the prior figures; and with other features such as the shunts 72 and dimples 80 (FIGS. 9 and 10). After the patterning of the packages and the streets 95 between the packages, various die 31 can be loaded into the packages locations. Note that the shunts can be tested before die 31 are assembled and soldered in place, and each package can be tested before singulation of the packages. Further, the die loaded into the packages may be diverse die such as combination of MOSFETs, IGBTs, diodes and the like.

It is very desirable to test the shunt 72 values before any silicon or other die is mounted in the respective package to reduce yield loss. After tests are carried out at wafer level, the DBC cans can be singulated by sawing, dicing or physically breaking at the streets 95.

Note that the packages can be singulated in clusters of two or more packages. Two package clusters are shown on the right hand half of FIG. 12.

Note also that vias may be omitted in selected package locations on the card 12, and in selected ones of a cluster of packages.

The formation of the packages on card 90 has benefits in connection with the shipment of packages to a customer. Thus, the cards can be shipped to a customer intact and singulated by the user at the user's site. The cards can be protected by a suitable foil for shipment and can be prescribed for easy break-off or singulation of packages by the end user.

A further conductive heat sink or plate 131 may be attached by solder or a conductive adhesive glue to the conductive segments of devices 30 to provide additional double-sided cooling for devices 30. The conductive plate 131 is electrically insulated from devices 30 by the insulation layers 31.

A second DBC or other wafer/substrate is provided to make contact with the exposed electrodes at the top surface of the first DBC wafer of FIGS. 1 to 12 of copending application Ser. No. 11/641,270. The use of two such DBC wafers is the subject of co-pending application Ser. No. 60/747,952.

Figure 13:
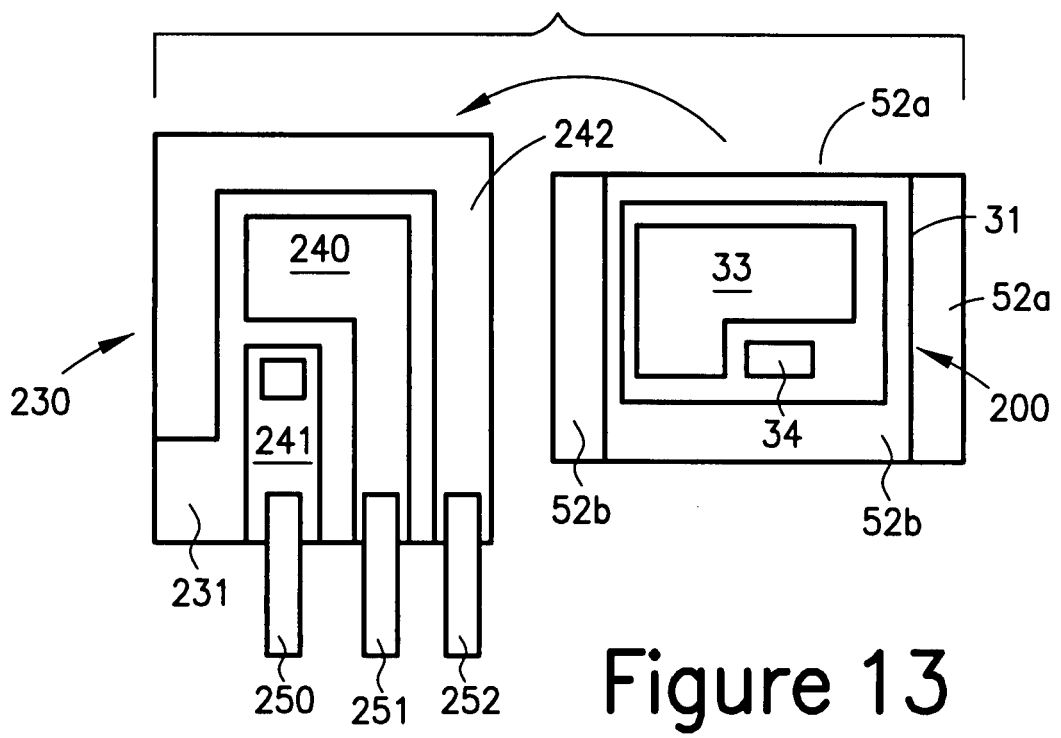
FIG. 13 is a top view of two DBC wafers, one carrying a semiconductor die and the other a connection pattern for the die when the wafers are sandwiched together.
Figure 15:
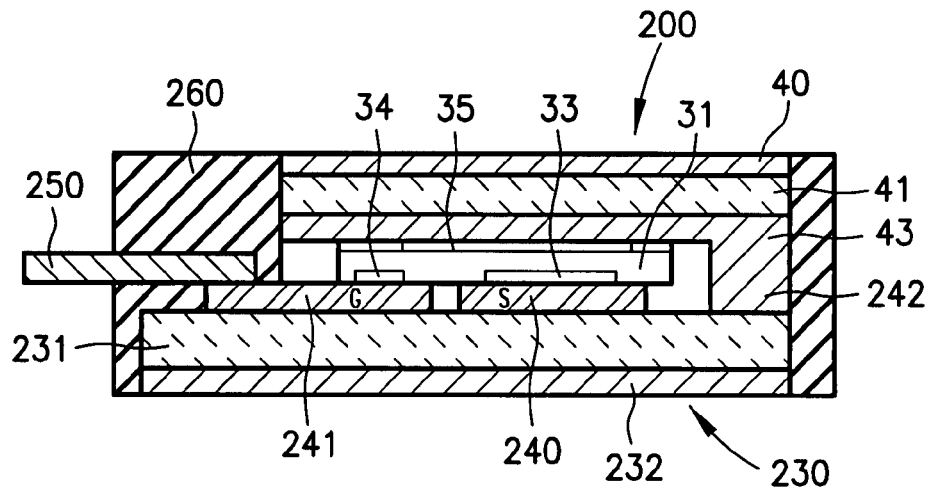
FIG. 15 is a cross-section of FIG. 14 taken across section line 15-15 in FIG. 14.

Thus, FIG. 13 shows a first DBC wafer 200, similar to that of FIGS. 1 to 12 and particularly FIG. 4a in which a MOSFET (or IGBT) die has a source contact 33 (of different shape than that of FIG. 4a) and a gate contact 34. Die 31 is soldered to the surface 50 of depression 51 in copper layer 43 and is spaced as shown from rim portions 52a and 52b. FIGS. 13 and 15 also show the second conductive (copper layer 40 and insulation substrate 41 for DBC wafer or assembly 200.

A second DBC wafer assembly 230 is provided (FIGS. 13, 14, 15 and 16) to provide contact connections to the source 33, gate 34 and drain contact 35 of wafer 200 and to provide a second coolable surface to the assembly.

Figure 14:
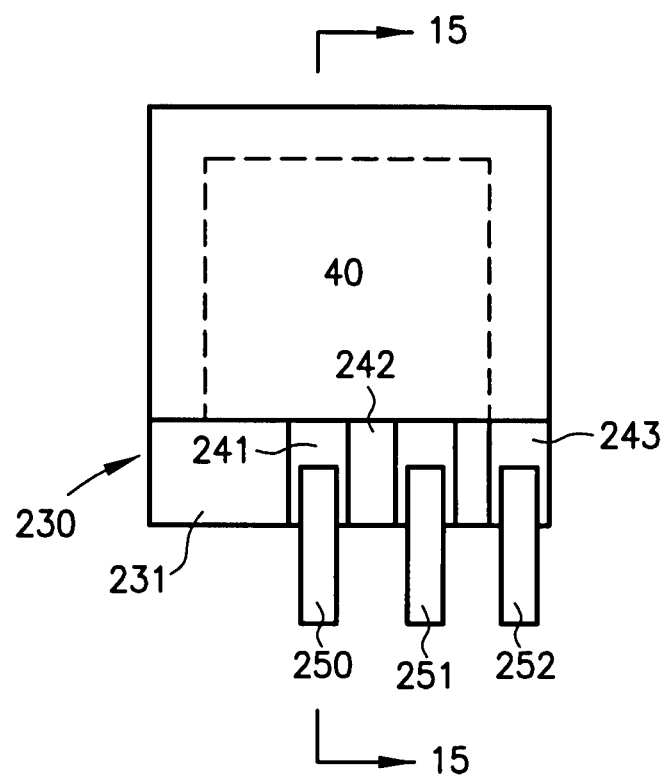
FIG. 14 is a top view of the wafers of FIG. 13 after the sandwiching and connection of the wafers.

Thus, the second DBC wafer 230 consists of a body like that of wafer 200, and having a central ceramic body 231 having a bottom copper layer 232 (FIG. 15) and a patterned top copper layer which is patterned to have a source trace 240, a gate trace 241 and a drain (rim) trace 242. The drain rim 242 can be extended at its left hand side in FIGS. 13 and 14, if desired, and a separate drain contact lead an be connected at that location. All traces are etched down to the surface of ceramic layer 231 to insulate the traces from one another. Traces are arranged such that the wafer 200 can be rotated from the position of FIG. 13 over and on top of wafer 230 as shown in FIGS. 14 and 15 to sandwich the die 31 with traces 240, 241 and 242 contacting source metal 33, gate metal 34 and rims 52a, 52b respectively.

A conductive lead frame of conductive leads 250, 251, 252 may be soldered to traces 241, 240, 242 respectively and extend beyond the periphery of the sandwich to act as terminals for the device.

The traces 241, 240 and 242 may be connected to electrodes 34, 33 and 52a, 52b by solder or conductive epoxy or the like, and may be secured simultaneously with the adhering of lead frames 250, 251, 252 to traces 241, 240 and 242. Additional die and corresponding lead frame terminals can be added as desired for copacked die within the sandwich.

Figure 16:
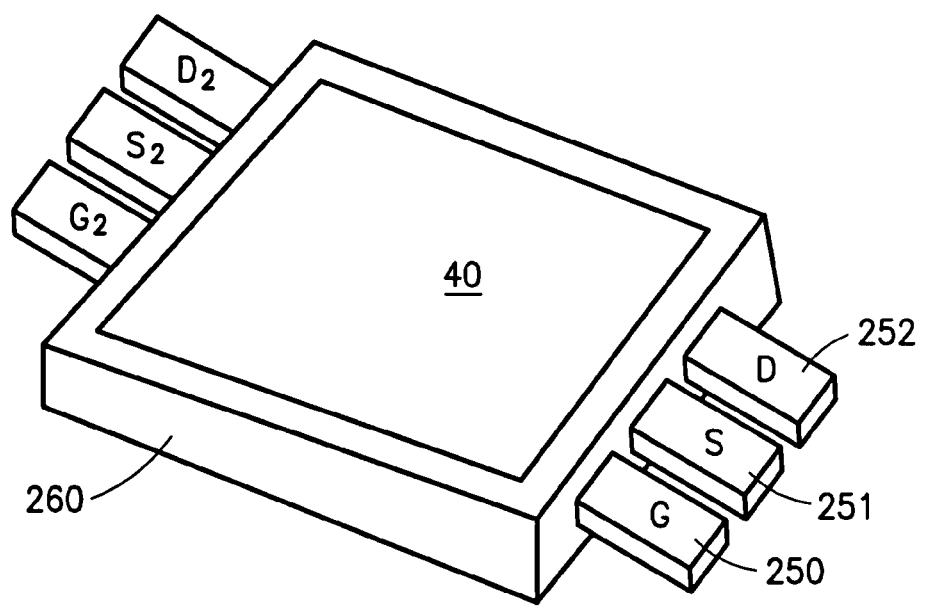
FIG. 16 is a perspective view of the package of FIGS. 13, 14 and 15.

The assembled sandwich of die 31, wafer 200 and wafer 230 can then be overmolded with any suitable known plastic insulation mold mass 260 (FIGS. 15 and 16) leaving the outer surfaces of copper conductors 40 and 232 exposed as shown in FIGS. 15 and 16.

The completed structure can now be cooled from both sides of die 31 and from insulated copper conductors 40 and 232 (FIGS. 14, 15 and 16) by air or liquid coolants.

Thus, in the novel assembly of FIGS. 13 to 16, the bottom DBC wafer 230 provides contact pads for the die 31 inside the DBC wafer 200. The die 31 can be any MOSgated device or diode or the like, and plural die can also be mounted in DBC wafer 200 and contacted by suitable conductive traces in lower DBC wafer 230. Thus, any copack of two or more die, for example, a high side and low side switch can be housed in a single sandwich.

Suitable means may be provided to align the top and bottom DBC wafers during soldering such as the dimple structure previously described, solder resists, adjustment elements and the like. Further, means can be provided to insure against arcing or voltage breakdown, and to increase the creepage or clearance distance between terminals such as isolating layers, solder stop resist, polyimide foils and the like. Selective etching can also be used to increase critical distances between the DBC "can", the semiconductor die and the bottom DBC. An underfill epoxy can also be employed.

Note that the sandwich of FIGS. 15 and 16 is very flat and, with a typical DBC wafer thickness of 1 to 1.5 mm, the sandwich thickness will be from 2 to 3 mm. The DBC wafer sandwich can have a length and width, for example, 10 to 15 mm, depending on the number of die within the sandwich. Where plural die are used, added lead frame terminals, for example terminals 270, 271 and 280 can be added to the assembly as shown in FIG. 16, and extending from the sandwich edge opposite to terminals 250, 251, 252. The various lead frame terminals can be customized in shape, thickness, material, plating and the like to a particular application.

It now becomes possible to mount the assembly of FIGS. 15 and 16 in such a way that two sided cooling can be carried out. Thus, two separate metal heat sink plates can be fixed to copper layers 40 and 232 in FIGS. 15 and 16 as by gluing or soldering or the like.

Figure 17:
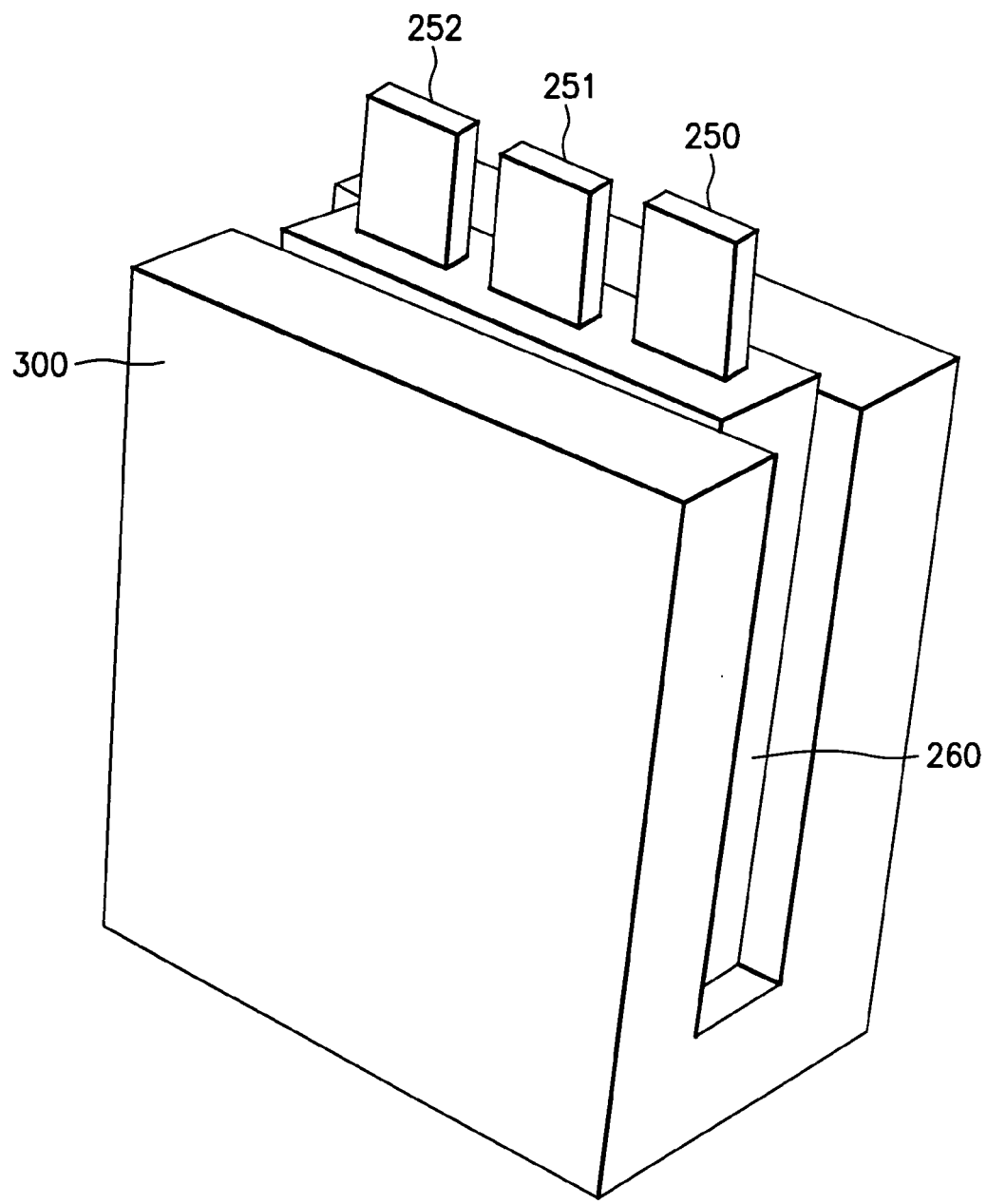
FIG. 17 is a perspective view of a U-shaped heat sink connected to the package of FIG. 16.

FIG. 17 shows a U-shaped metal clip 300 which can be mechanically sprung over the surfaces of copper layers 40 and 232 of FIGS. 15 and 16 and in pressure contact with those surfaces. Solder, thermally conductive glue or thermal grease can also be employed to assure good cooling from both sides of the DBC sandwich.

Figure 18:
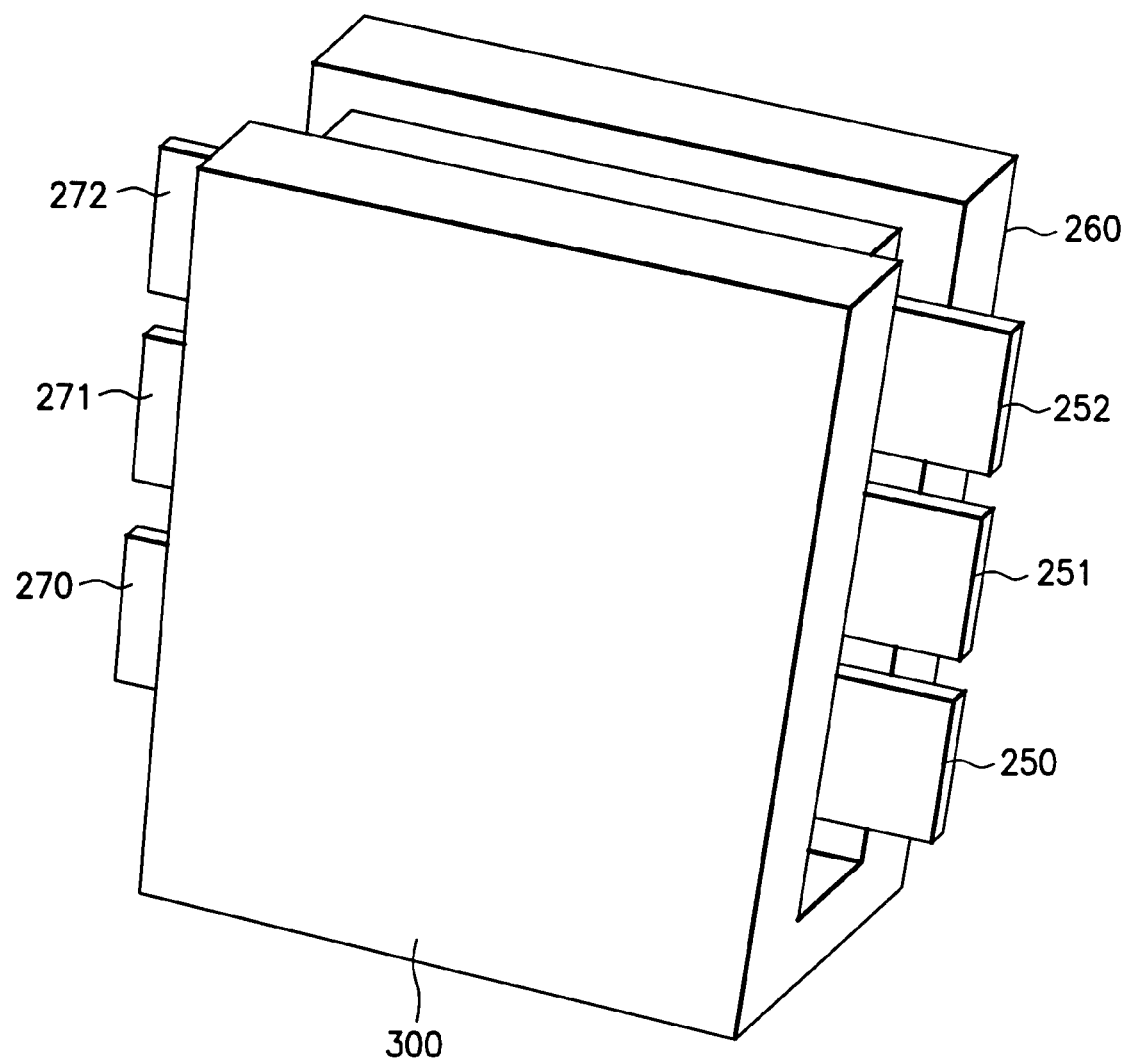
FIG. 18 is a perspective view of an alternative clip arrangement for the package of FIG. 16.

The clip 300 can be rotated to the position shown in FIG. 18 if two sets of leads 250, 251, 252 and 270, 271, 272 extend from the opposite sides of the housing.

Figure 19:
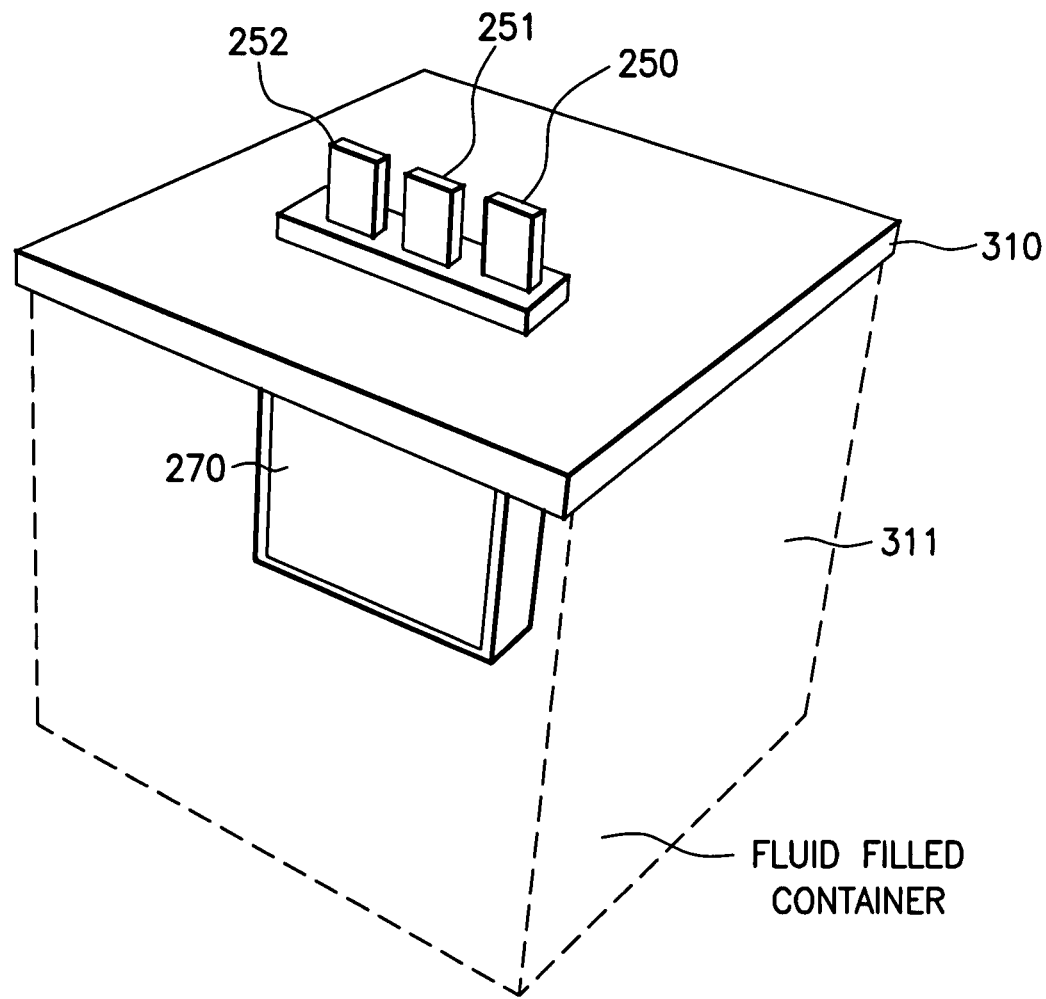
FIG. 19 is a perspective view of the package of FIG. 16 mounted in a liquid cooled chamber.

It is particularly possible with the assembly of FIG. 17 to expose the coolable surfaces to a cooling liquid since the terminals 250, 251 and 252 are insulated from copper plates 40 and 232. Thus, as shown in FIG. 19, the assembly 300 can be fixed at its end surface adjacent terminals 250, 251, 252 to a mounting plate 310 which seals the top of coolant reservoir 311. Coolant fluid can be circulated as desired within or into and out of chamber 311.

Figure 20:
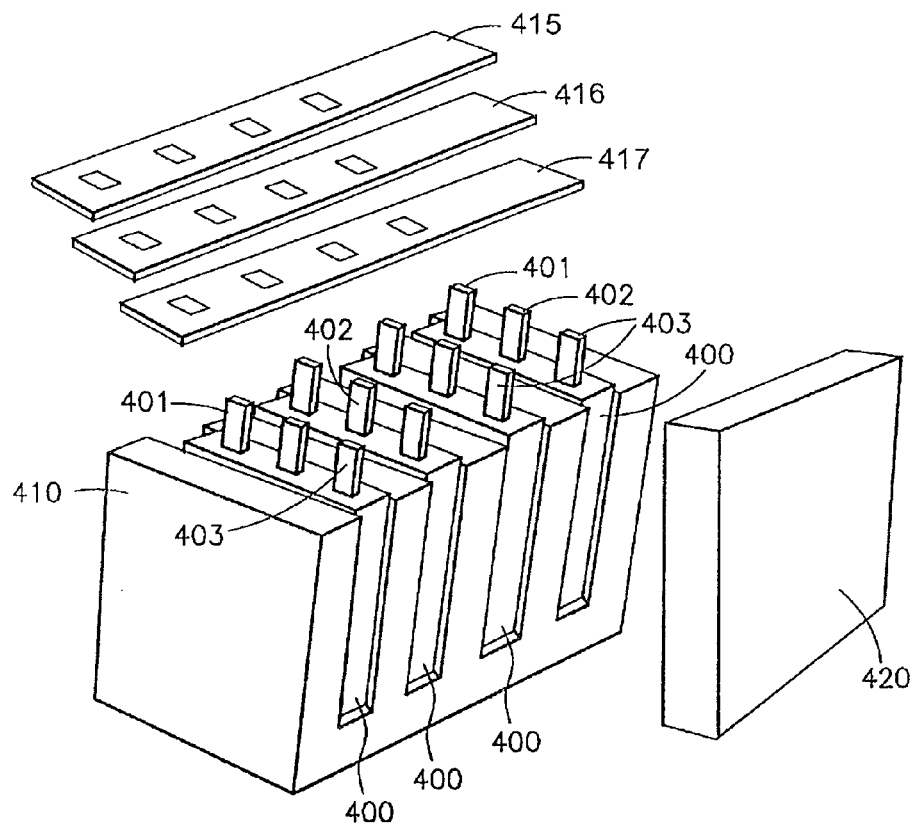
FIG. 20 shows an exploded perspective view of an assembly of 4 packages of the type shown in FIG. 16 in a conductive clamping comb, with drain, source and gate contact lead frames for connecting the related terminals of each package.

Referring next to FIG. 20, there is shown and embodiment of the invention in which a plurality of flat double-sided cooled packages 400 of FIG. 16 are to be assembled in a given circuit and are available for 2-sided cooling. In the foregoing, as in the prior description, the same reference numeral is used to identify like parts or components. Further, the thin packages 400 which are coolable from both sides and a sandwich of one or more semiconductor die are preferably of the type shown in FIGS. 1 to 19, employing 2 DBC wafers; but in the assemblies to be described, the packages can take other forms, so long as embedded semiconductor devices are assembled between and are electrically insulated from but are in good thermal communication with the two outer surfaces of the individual packages.

By a thin package is meant a preferably, but not necessarily, rectangular package of thickness less than about 5 mm or more with 2 or more terminals connected to the internal semiconductor die and extending from one end of a plastic encapsulated housing. Insulated thermally conductive plates (such as copper) on the opposite device sides of the package.

In FIGS. 20 to 37 the individual packages are described by numeral 400 and contain a power MOSFET having extending gate, source and drain contacts 401, 402, 403 respectively. However, plural die and added respective leads can be employed, and the die may be any MOSgated power die such as IGBTs with free wheeling diodes, Bipolar transistors, JFETs, MOSFETs, diodes and the like.

Referring to FIG. 20, 4 packages 400 are mounted between the flat teeth or fingers of comb-shaped metal clip 410 with their gate, source and drain terminals 401, 402 and 403 respectively protruding beyond the ends of the clip fingers. The areas of the clip teeth are coextensive with the outer copper plates of the DBC wafers (for example, plates 40 and 232 of FIG. 15).

The comb-shaped clip 410 may be copper with its internal surfaces soldered, glued and/or pressed against the exposed copper surfaces of each package, using thermal grease or thermally conductive adhesives to make good thermal connection to all packages 400. Conductive lead frames 415, 416 and 417 which are insulated from one another, are provided to electrically connect all gate, source and drain terminals 401, 402 and 403 respectively to one another.

An additional heat sink 420 of copper or the like can be connected to one or both sides of clip 410.

Figure 21:
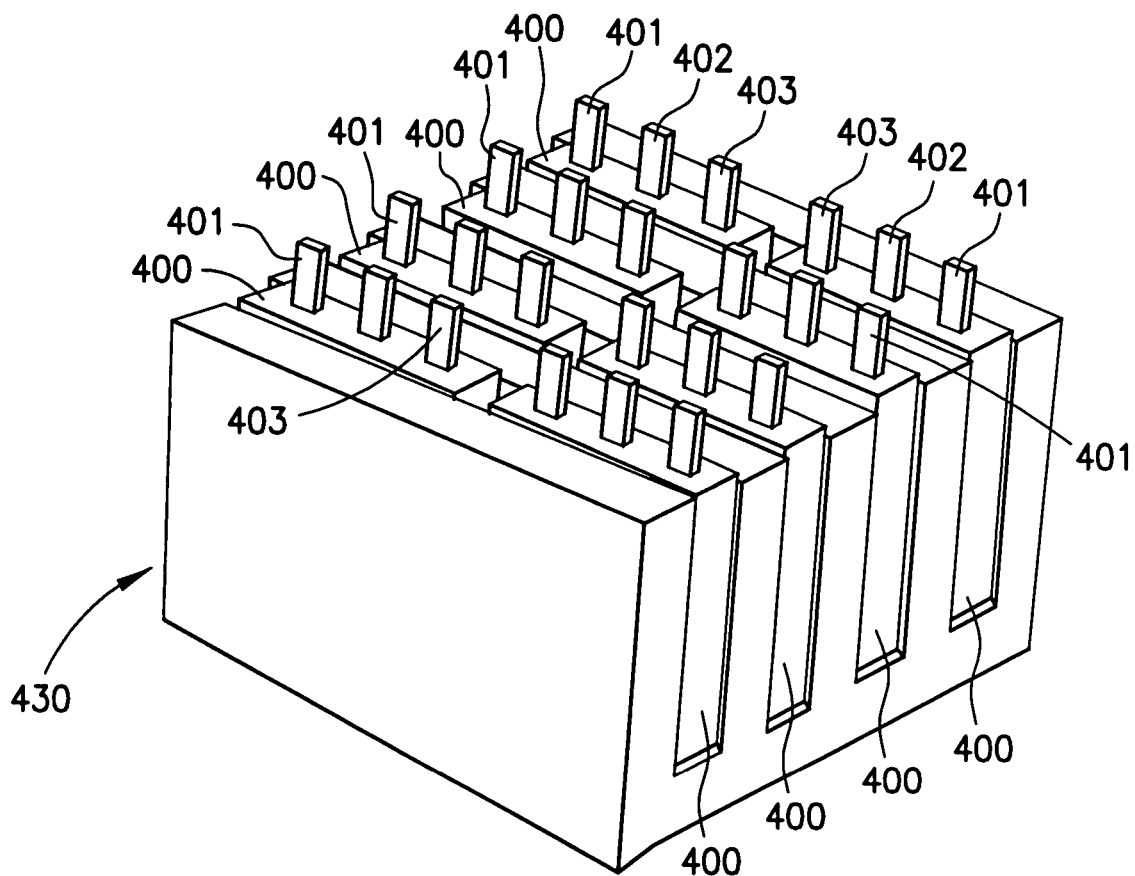
FIG. 21 shows an assembly like that of FIG. 20 in which two packages are located side-by-side in each slot of the support comb.
Figure 25:
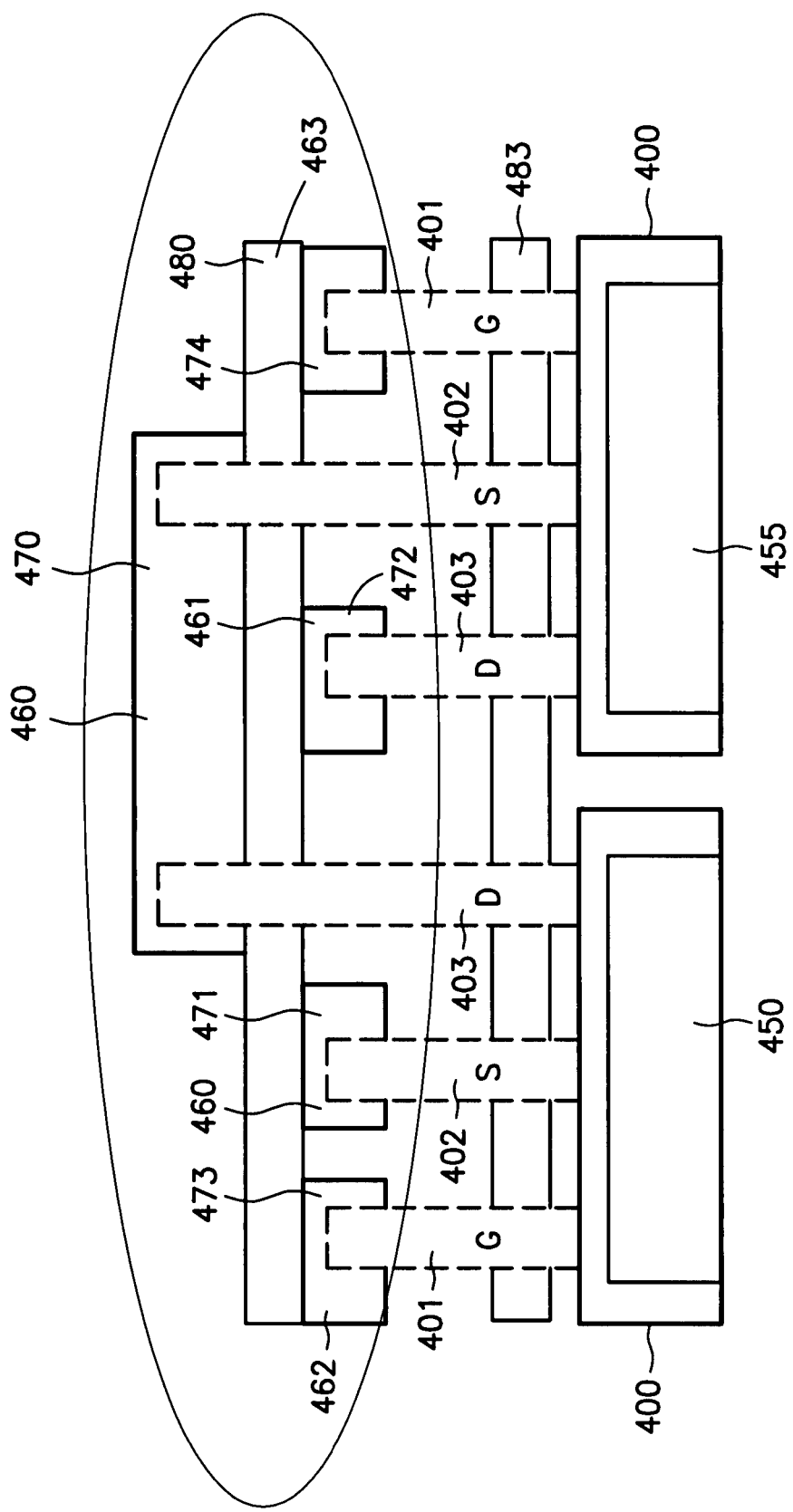
FIG. 25 is a schematic front few of FIG. 21 with leads connected to form the circuit of FIG. 24.
Figure 26:
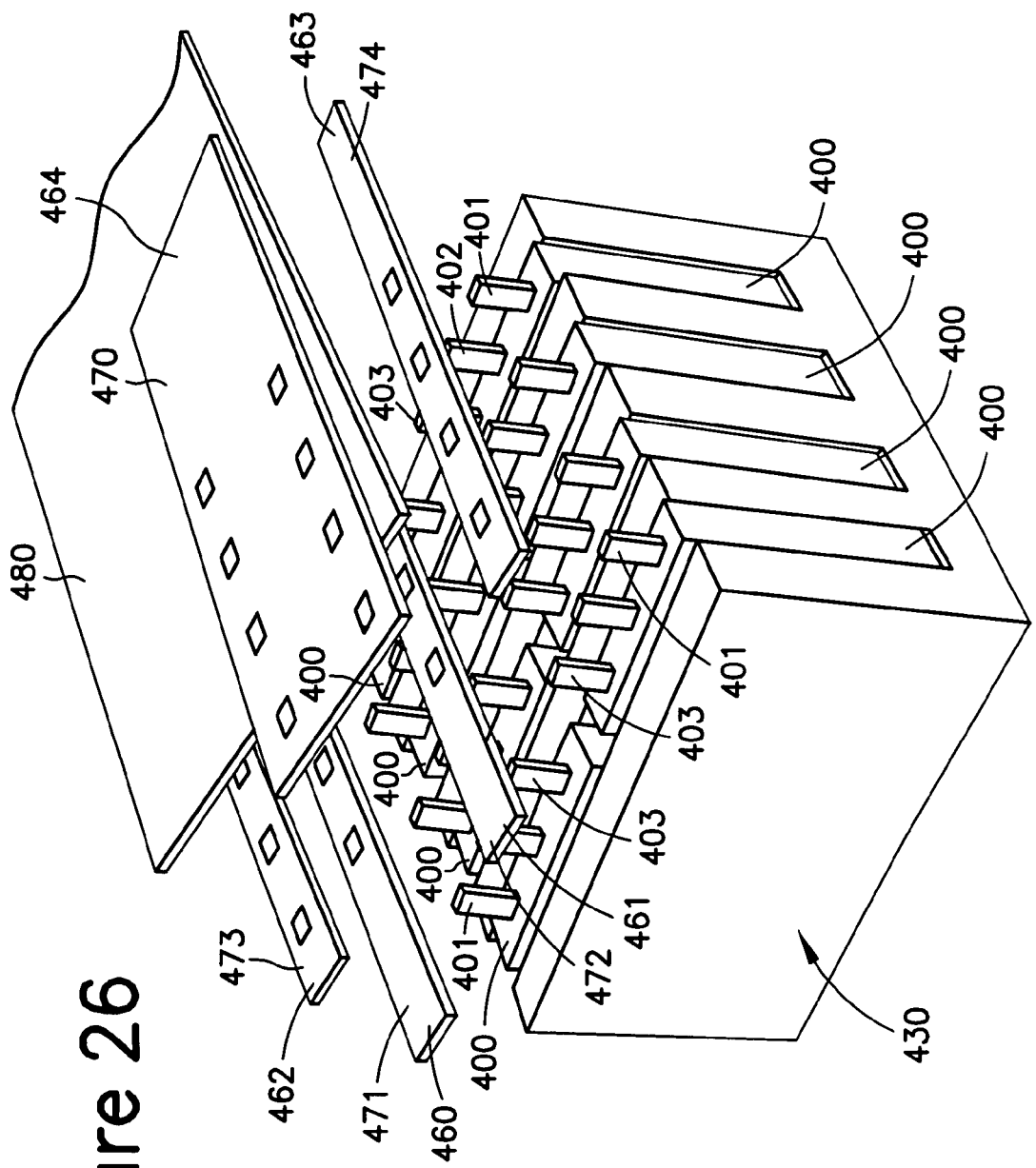
FIG. 26 is an exploded perspective view of the assembly of FIG. 22 with lead frames to define the structure of FIGS. 24 and 25.
Figure 27:
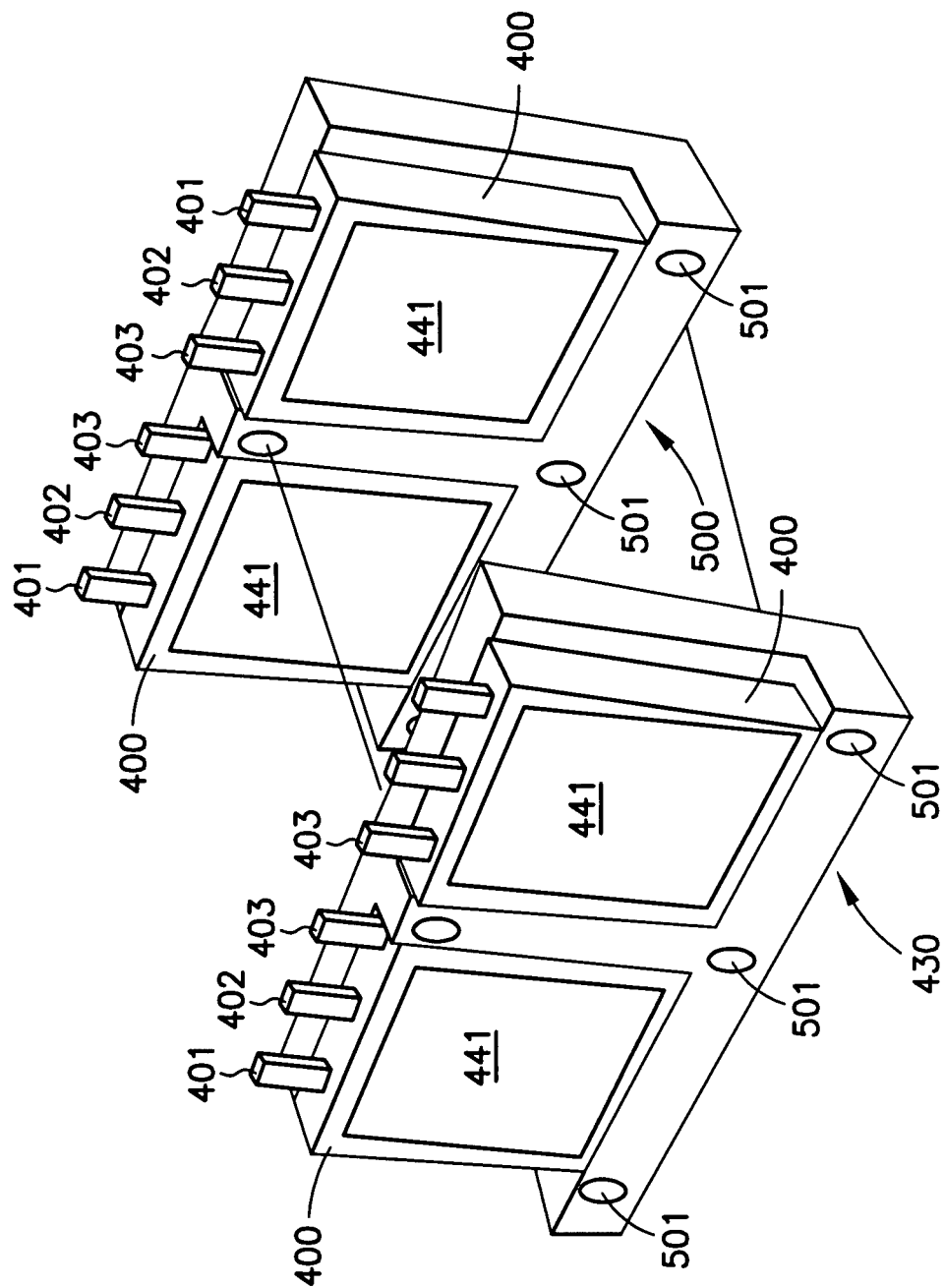
FIG. 27 is a perspective view of a sub-assembly for second embodiment of the invention.

FIG. 21 shows an alternative conductive clip 430 which has elongated fingers permitting two packages 400 to be assembled in the slot between each adjacent pair of comb fingers as shown. Lead frames, to be described in connection with FIGS. 25, 26, 27 are used to make suitable connections to the terminals of packages 400.

Figure 22:
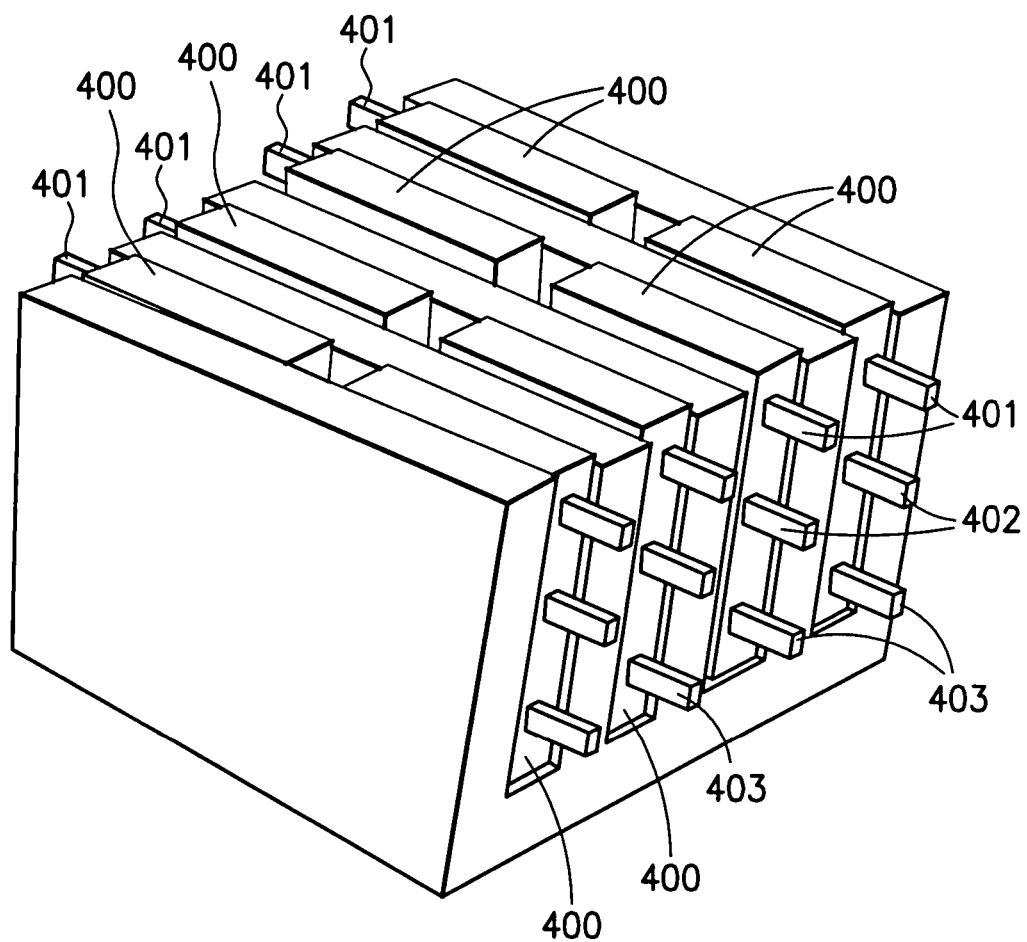
FIG. 22 shows an alternative position of side-by-side packages in a comb such as that of FIG. 21 in which the terminals of the packages extend from the sides of the comb.

FIG. 22 shows a modification of FIG. 21 in which the packages 400 are rotated 90° so that their terminals extend from the sides of the clip 430. Lead frames (not shown) extending along each side of the clip 430 will make the desired connection to each package terminal.

Figure 23:
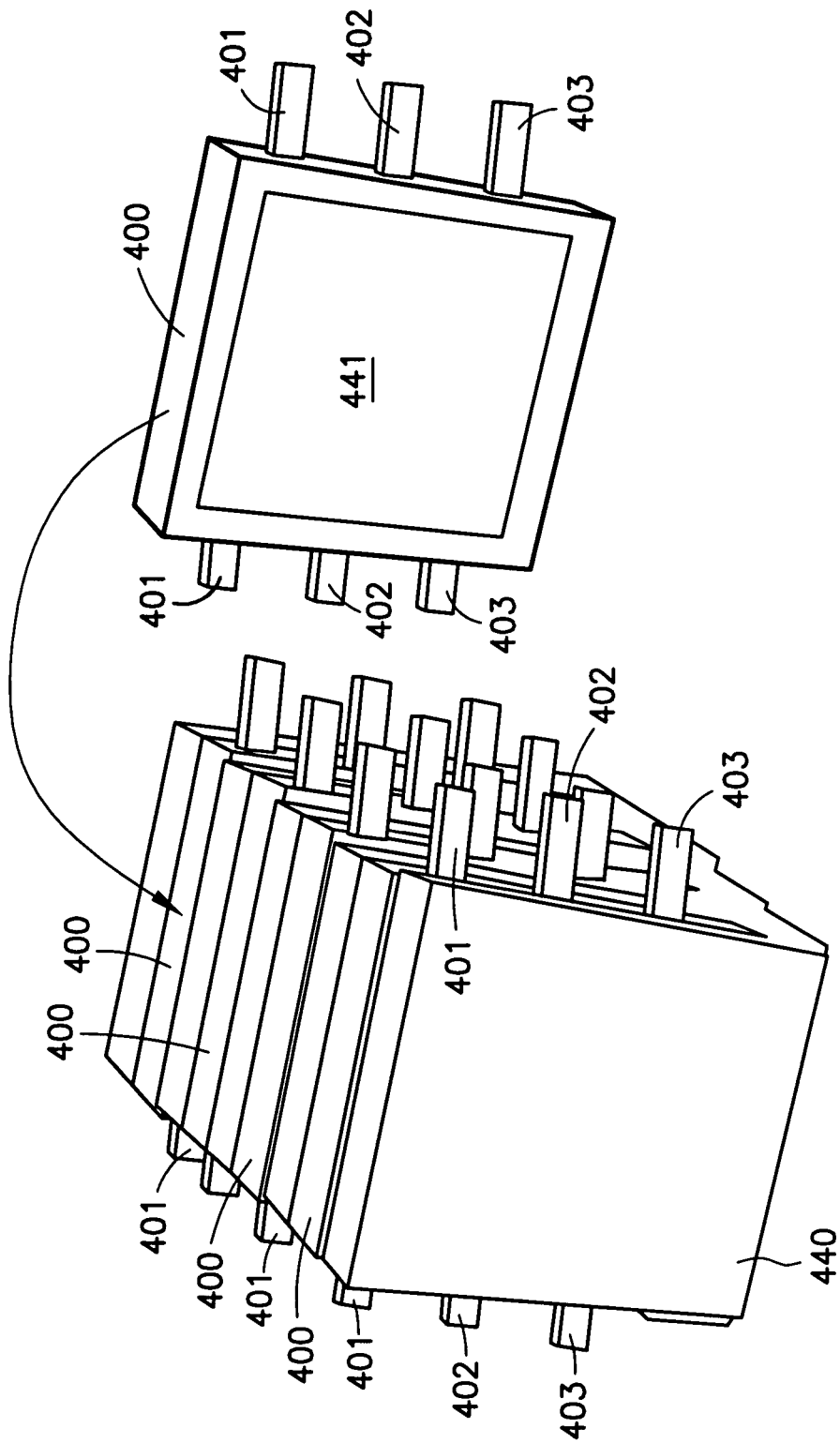
FIG. 23 shows a comb-shaped conductive support for receiving packages of the type shown in FIG. 18.

FIG. 23 shows still another embodiment of the invention in which package 400 of FIG. 22 is a copack of at least two MOSFETs, for example, like that of FIG. 17, with the die terminals extending from opposite ends of the package. Plural stacked devices of this kind are mounted between the fingers of the comb shaped heat sink 440 and are in good thermal contact with the copper surfaces such as surface 441 of package 400 in FIG. 23. Again, lead frames (not shown) on the opposite sides of clip 440 will connect the terminals of packages 400 according to application requirement.

Figure 24:
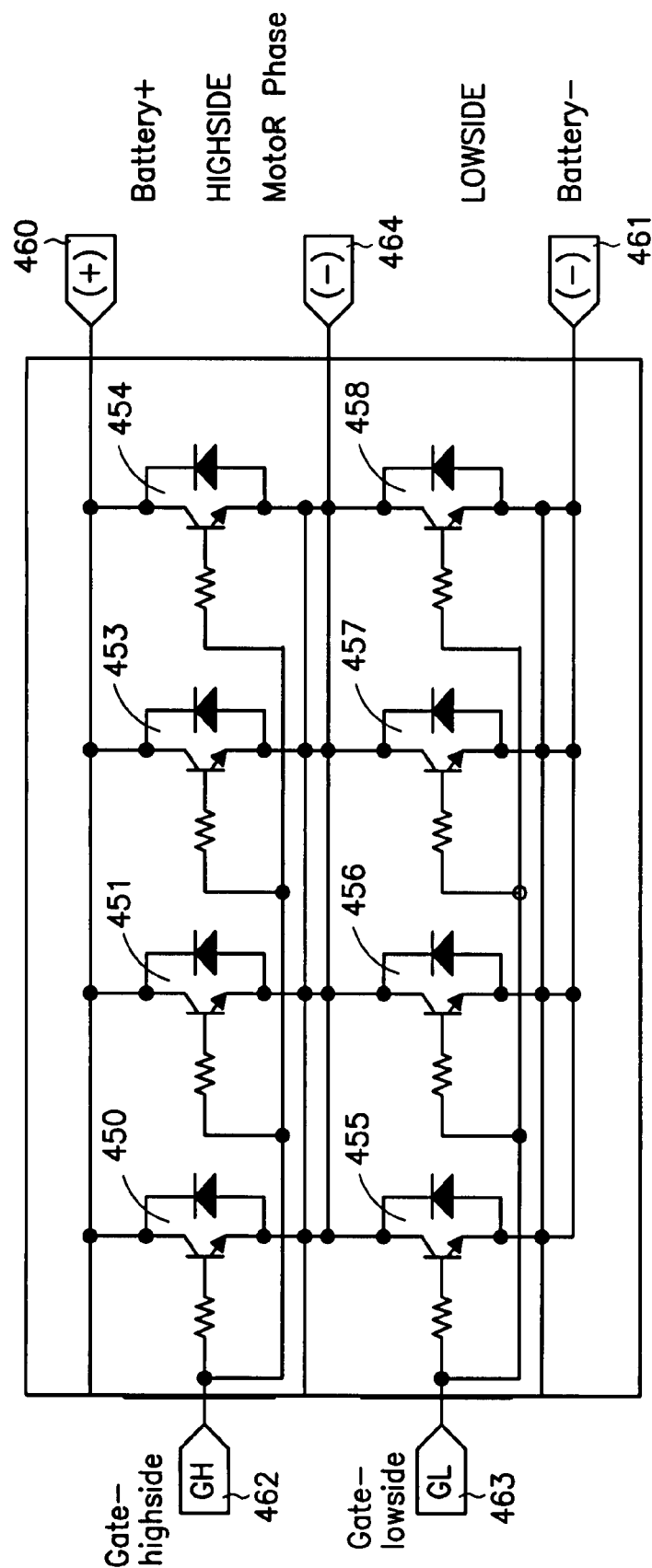
FIG. 24 shows a circuit diagram of a single phase half-bridge with 4 parallel switch die in each arm.

FIG. 24 is a circuit diagram of a half bridge power module using a copack of 4 IGBT die (4 packages 400) with respective parallel connected free wheeling diodes on each side of the switch. Any other desired application circuit can be provided. Further the IGBTs could be replaced by power MOSFETs if desired with the source and drain terminals rather than emitter and collector electrodes respectively. Further note that while 4 packages 400 are shown in parallel, that any desired number of parallel packages or die can be used.

In FIG. 24, the high side section of the bridge comprises 4 IGBT copacks 450, 451, 452 and 453; and the low side section comprises 4 IGBT copacks 455, 456, 457 and 458. Each of die 450 to 458 is contained within a respective two sided cooled packages. Where the circuit is adapted to drive a motor from an automative battery, for example, the battery (+) and (−) terminals 460 and 461 respectively are connected as shown and the nodes between switch pairs 450, 455; 451, 456; 453, 457; 454, 458 are connected to a motor phase 464. Suitable gate control circuits are connected to the high side and low side gate terminals 462 and 463 respectively.

The circuit of FIG. 24 is easily carried out in the assembly of the invention with the arrangements of FIGS. 21, 22 and 23, by appropriate lead frame connections to the device terminals.

FIGS. 25 and 26 show a novel low inductance multilayer lead frame arrangement for the assembly of FIG. 21 to create the circuit of FIG. 24 (with MOSFETs). Thus, the assembly is shown with a motor phase lead frame 470 which receives all high side drain terminals 403 and all low side source terminals 402; a battery (+) lead frame 471 which receives all of the source terminals of the high side (left) source terminals 402, a battery (−) lead frame 472 which receives all low side drain terminals 403, a high side gate lead frame 473 which receives all high side gate terminals 401 and a low side gate lead frame 473 which receives all low side gate terminals 401.

The lead frames 470, 471, 472, 473 and 474 may be supported as shown in FIGS. 25 and 26 relative to an insulation carrier sheet 480 so as to be insulated from one another. An optional isolation layer 483 may be added to ensure lead frame insulation. The device terminals may be connected to their respective lead frames as by soldering, welding, press-fit or fit-through mounting. The lead frame layers may also be changed with respect to the surfaces of isolation layer 480 as desired. The insulation housings of packages 400 may also be used as isolation and control elements to eliminate the need for the optional isolation layer 481 of FIG. 25.

Note that the multi layer lead frame can be a sub assembly which can be connected to all contacts in a single step. The various terminals can be shaped as desired. Further, any desired circuit can be formed, for example H bridges and the like in which lead frames make appropriate contact to the terminals of 4 packages 400. Further, gate driver circuitry (the gate driver board) sensors, protective circuits bus capacitors and the like can be mounted on the sides and bottoms of the heat sink.

The heat sinks or combs 410, 430 and 440 of FIGS. 20 to 23 may have other shapes than those shown and can have primary and secondary cooling elements. For example, the combs can have cooling fins for more efficient fan-cooling or liquid cooling, and can have internal channels to conduct liquid coolants. Such active or passive cooling elements are best mounted on the base or side walls of the comb or clip.

Further the heat sinks 410, 430 and 440 may be a single die cast component or can be formed of modular plate-like elements connected together as by a screw-type fastener, or by welding, soldering or other adhesive.

FIG. 27 shows modular conductive heat sink elements 500 which each receive two side-by-side packages 400. Any desired number of such modules can be stacked together and clamped or otherwise connected by screws or bolts through screw holes 501 to press the heat sink surfaces into thermal contact with the surfaces, such as copper plate 441 of packages 400. A thermally conductive adhesive or thermal grease can be used to obtain the most efficient two-sided cooling of the packages 400.

Figure 28:
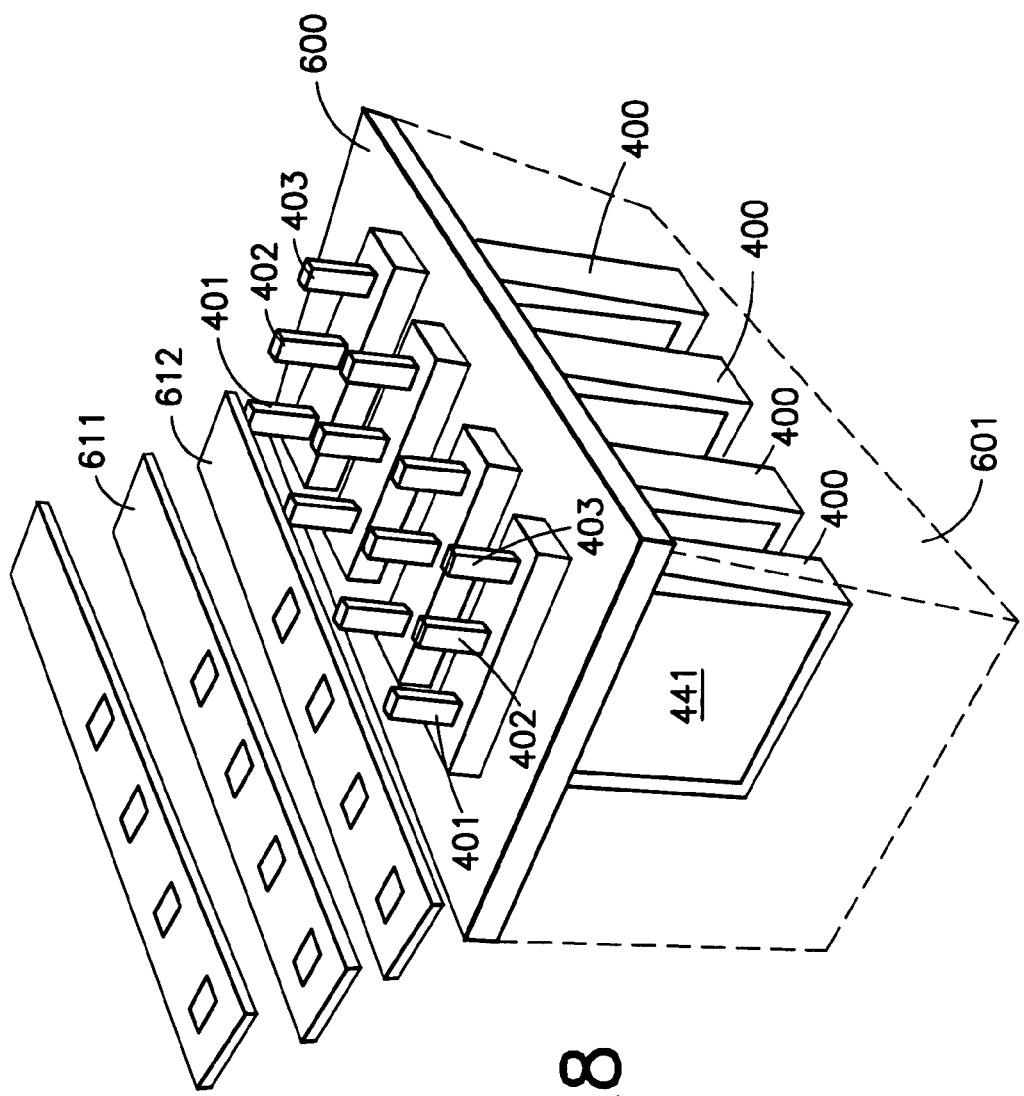
FIG. 28 shows a further embodiment of the invention in exploded perspective view in which plural packages are suspended from a common cover and are immersed in a liquid cooling immersion bath and with lead frame connectors for the exposed terminals.

FIG. 28 shows a further embodiment of the invention in which the tops of packages 400 are fixed to openings in the mounting and sealing plate 600 which is adapted to cover the schematically illustrated liquid cooler volume 601 which contains a liquid heat exchange fluid. The devices may be glued or pressed into plate 600 and their cooling surfaces are immersed in the coolant. Lead frames 610, 611 and 612 will receive and interconnect terminals 401, 402 and 403 externally of the coolant volume 601. Note that coolant inlets and outlets (not shown) may be provided to circulate a coolant.

Figure 29:
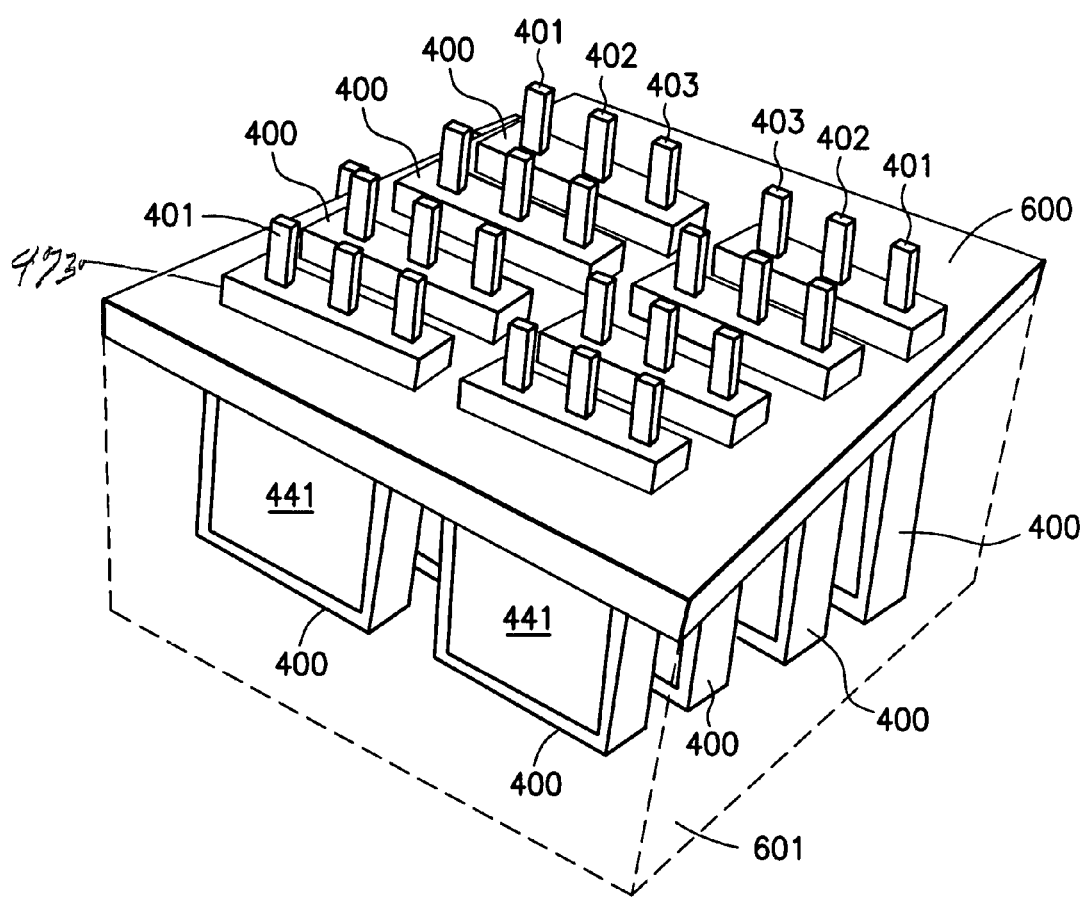
FIG. 29 shows the embodiment of FIG. 30 with plural rows of packages.

FIG. 29 shows a further embodiment of FIG. 28 in which cover plate 600 receives a second row of packages 400. While the walls of the coolant container or immersion bath 601 are not shown, they can be conventionally used for attachment of and cooling of other electronic components such as driver boards, capacitors and the like.

Figure 30:
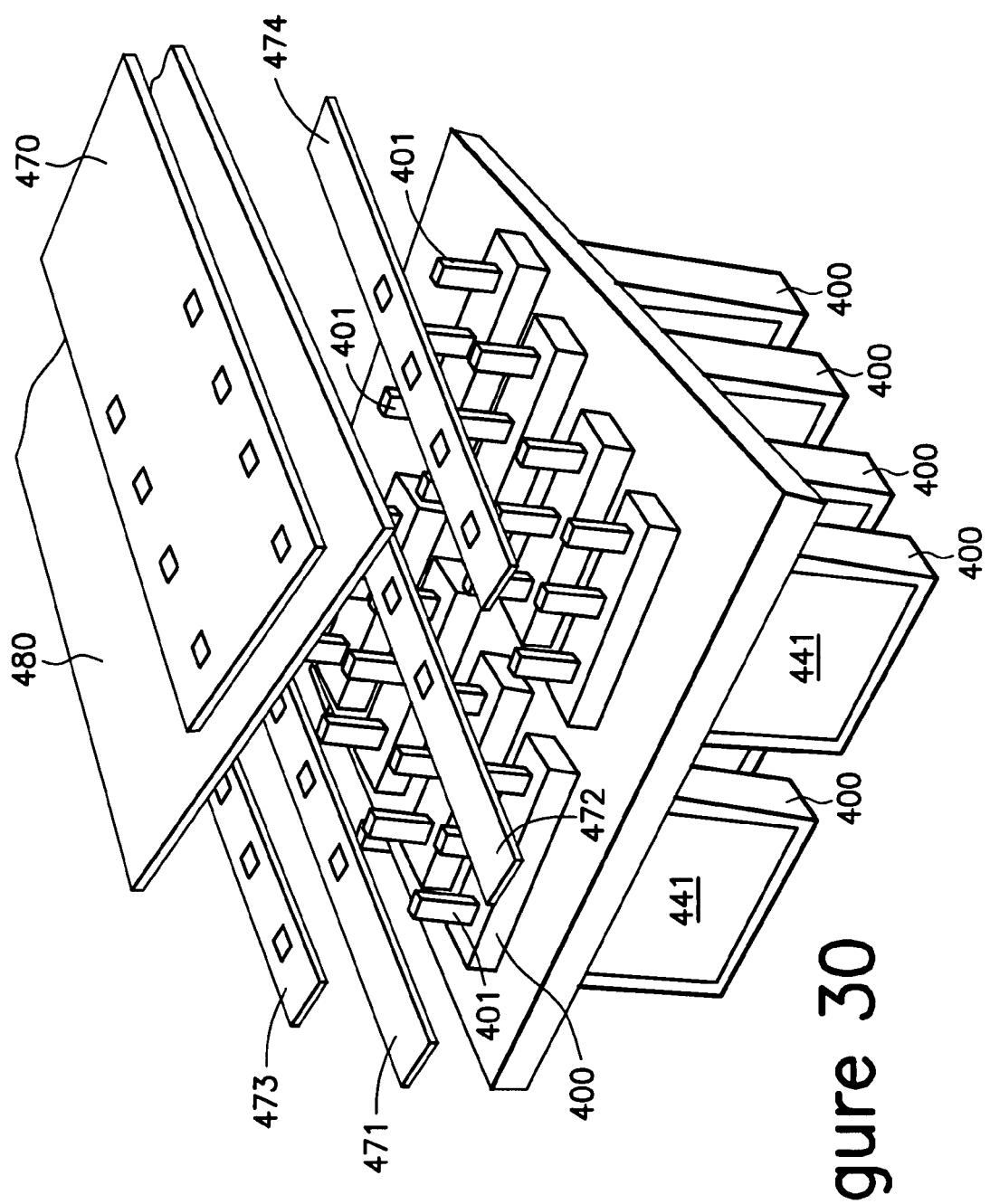
FIG. 30 shows the assembly of FIG. 29 with a lead frame (exploded away for clarity) to form the circuit and arrangement of FIGS. 24, 25 and 28.

FIG. 30 shows the lead frame arrangement of FIG. 26, as applied to the structure of FIG. 29. The coolant 601 is not shown. In the arrangement of FIG. 30, the various lead frames 470 to 474 and insulation sheet 480 are attached in separate process steps and then attached to each other.

Figure 31:
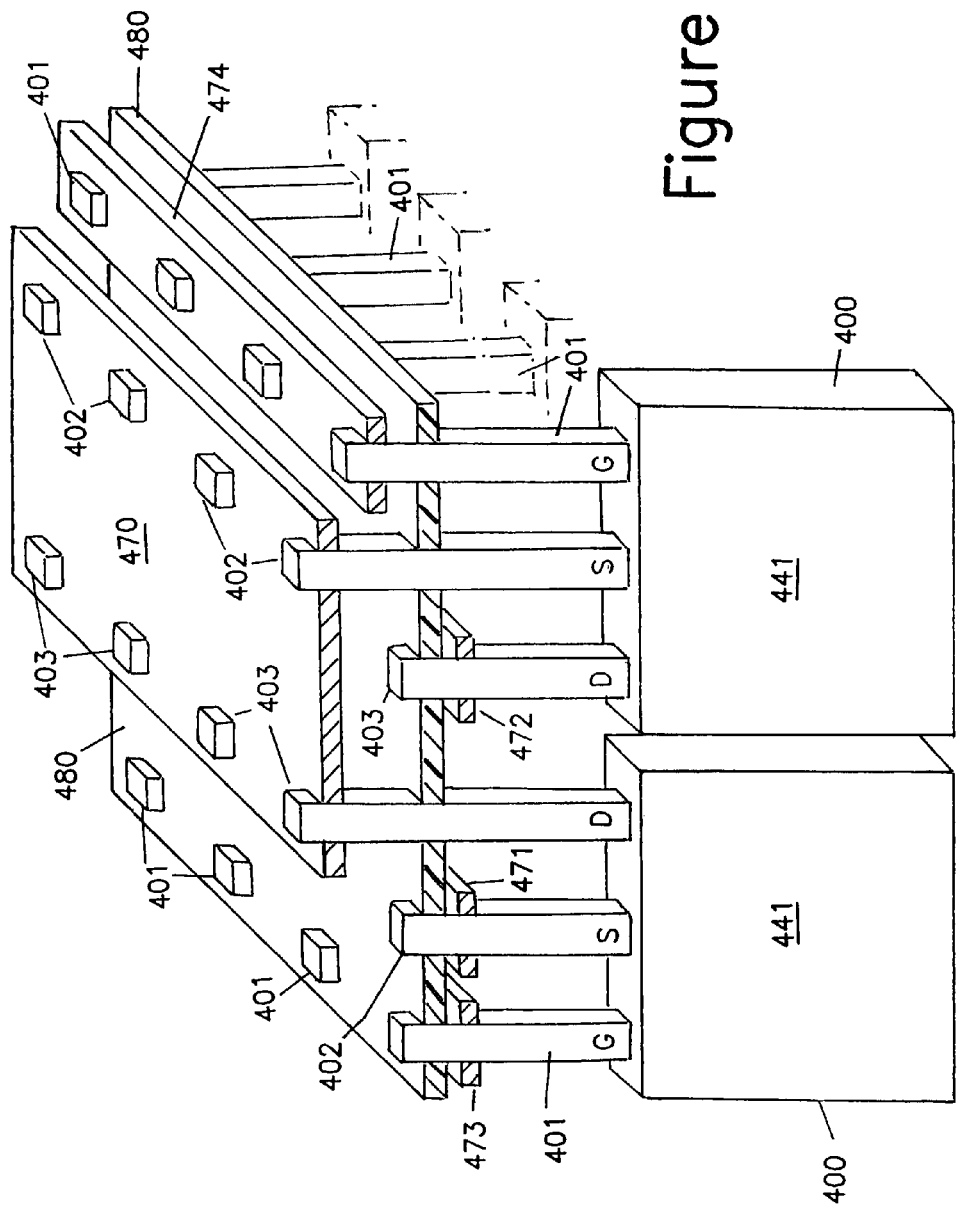
FIG. 31 shows the structure of FIG. 30 with a single multi-layer lead frame.

As shown in FIG. 31, a multi layer lead frame 650 may be used as a sub assembly in which all lead frames are pre-attached to insulation sheet 480 which is attached to the power switch in a single step.

Figure 32:
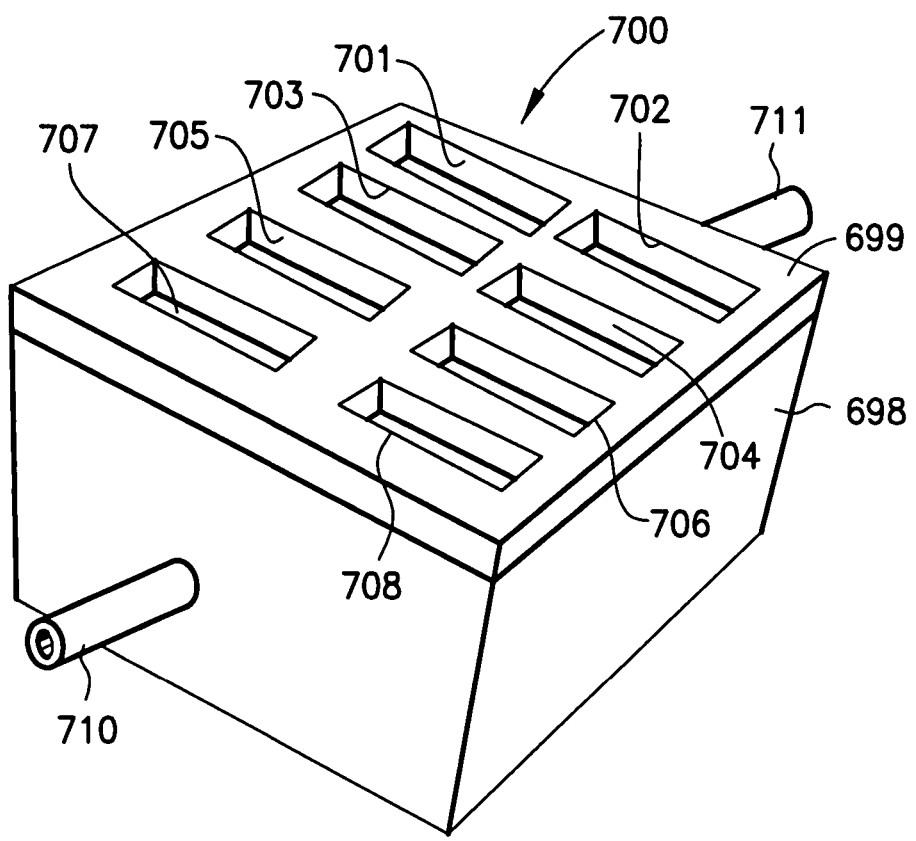
FIG. 32 is a perspective view of a liquid immersion bath which can receive plural flat packages

Referring next to FIG. 32, there is shown an immersion bath heat sink 700, which has a cover plate 699 which contains a plurality of flat package receiving openings 701 to 708 for receiving the bodies of packages 400 to a depth within housing 698 (which sealably receives cover 699) related to the package depth, for example, less than about 10 mm, with the terminal end portions of the packages protruding from the top of the cover 699. The walls of heat sink 700 may have further attachment elements which would benefit from contact cooling such as driver boards, capacitors and other parts not suitable for immersion in a liquid coolant. A fluid coolant inlet 710 and coolant outlet 711 are also provided into and out of housing 698.

Figure 33:
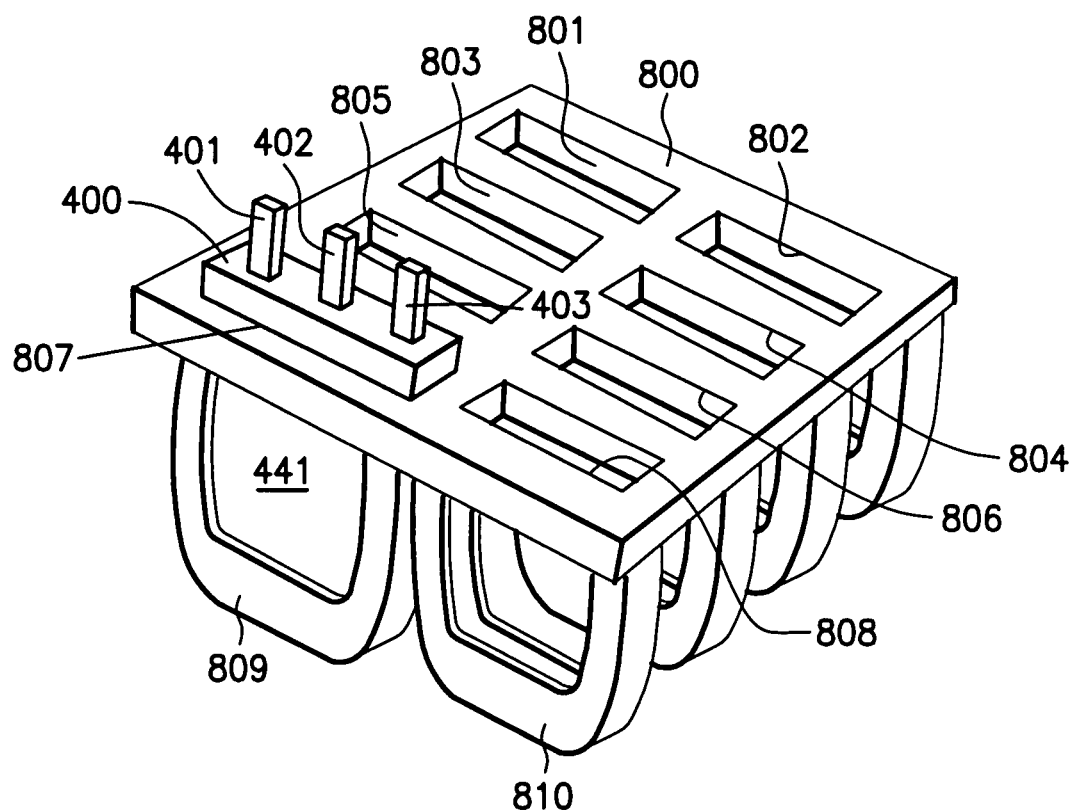
FIG. 33 is a perspective view of a further mounting support plate arrangement for receiving a plurality of flat packages.

FIG. 33 shows another version of the mounting and sealing plate 699 of FIG. 32 in which the plate 800 has openings 801-808 to receive 8 packages 400, but each opening has a U-shaped stabilizing sleeve or frame, such as integrated reinforcing frames 809, 810 for receiving the edges of packages 400. The reinforcing frame 809, 810, etc. is especially useful to resist cooling fluid flow pressure while leaving the package copper areas such as area 441 exposed to the cooling fluid. Other shapes can be used for the sleeve or frames 809, 810.

Figure 34:
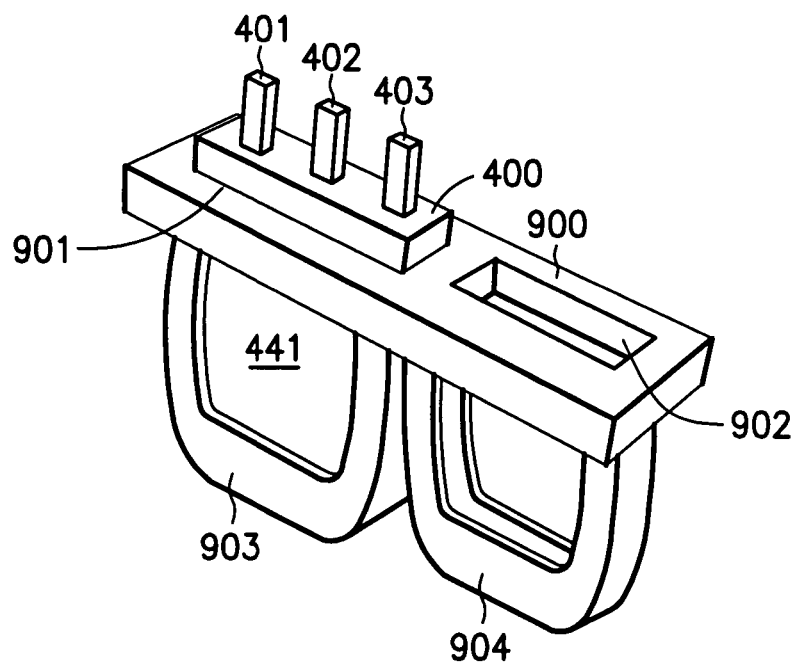
FIG. 34 shows a single plate of the type of FIG. 33 in which a plurality of such plates can be ganged together as desired.

The structure of FIG. 33 can be formed of modular elements 900, shown in FIG. 34. Each of modules 900 have 2 package-receiving openings 901, 902 and respective reinforcing frames 903, 904. The modular elements 900 can be stacked to any desired height by water-proof connectors such as bolts, welding, hard soldering, adhesives and the like.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A power module assembly comprising:
a plurality of packages, each of said plurality of packages comprising:
a thin generally rectangular body having top and bottom wafer assemblies each having an insulation layer formed between two conductive layers, wherein said top wafer assembly includes a top metallic surface and said bottom assembly includes a bottom metallic surface; and
first and second end surfaces perpendicular to and joining said top and bottom metallic surfaces;
at least one central semiconductor die disposed on an inner surface of said bottom wafer assembly of a respective one of said plurality of packages and having a plurality of terminals extending from at least said first end surface of said respective one of said plurality of packages;
said inner surface having a plurality of dimples formed thereon, said plurality of dimples extending through said inner surface and configured to act as solder stops and to self-align said at least one central semiconductor die;
said at least one central semiconductor die having first and second opposite surfaces thermally connected to said top and bottom metallic surfaces of said respective one of said plurality of packages and electrically insulated therefrom, and an insulation housing overmolded around side edges of said top and bottom metallic surfaces, enclosing at least a portion of the periphery of said respective one of said plurality of packages and insulating said plurality of terminals from said top and bottom metallic surfaces;
said power module further comprising a thermally conductive clip supporting said plurality of packages in a spaced parallel relationship, said top and bottom metallic surfaces of adjacent ones of said plurality of packages being spaced by a given space, being coextensive with respect to one another and being exposed for heat transfer to a cooling medium.

2. The power module assembly of claim 1, wherein said top and bottom metallic surfaces of each of said plurality of packages are soldered to said thermally conductive clip.

3. The power module assembly of claim 1, which further includes a lead frame assembly disposed atop said terminals of each of said packages and electrically connecting like terminals of each of said packages to one another.

4. The power module assembly of claim 1, wherein each of said packages comprise first and second DBC wafers which form a sandwich with said at least one central semiconductor die between them;
said top and bottom metallic surfaces of each of said packages comprising copper plates of said first and second DBC wafers respectively.

5. The power module assembly of claim 1, wherein each of said top and bottom metallic surfaces have a length and width each equal to or greater than 10 mm.

6. The power module assembly of claim 1, wherein said thermally conductive clip comprises a thermally conductive comb having rectangular comb fingers disposed in each given space between adjacent ones of said packages and in thermal contact with said top and bottom metallic surfaces of the packages defining said each of said spaces.

7. The power module assembly of claim 6, wherein said thermally conductive comb comprises a plurality of identical plates which are clamped together to define said comb.

8. The power module assembly of claim 6, wherein said terminals of each of said packages extend beyond the ends of the fingers of said comb.

9. The power module assembly of claim 6, wherein said terminals of each of said packages extend beyond the side edges of the fingers of said comb.

10. The power module assembly of claim 1, wherein each said at least one semiconductor die is a MOSgated device.

11. The power module assembly of claim 10, which further includes a lead frame assembly disposed atop said terminals of each of said packages and electrically connecting like terminals of each of said packages to one another.

12. The power module assembly of claim 11, which includes at least 4 packages having three terminals each, the terminals of each of said packages electrically connected in parallel by said lead frame assembly.

13. The power module assembly of claim 1, wherein the thickness between said top and bottom metallic surfaces of each of said packages is equal to or less than 5 mm.

14. The power module assembly of claim 13, wherein each of said top and bottom metallic surfaces have a length and width each equal to or greater than 10 mm.

15. The power module assembly of claim 14, wherein said thermally conductive clip comprises a thermally conductive comb having rectangular comb fingers disposed in each given space between adjacent ones of said packages, wherein said fingers are in thermal contact with said top and bottom metallic surfaces of the packages defining said each of said spaces.

16. A power module assembly comprising:
a plurality of packages, each said package comprising a respective semiconductor die and top and bottom wafer assemblies each having an insulation layer formed between two conductive layers, wherein said top wafer assembly includes a top metallic surface and said bottom assembly includes a bottom metallic surface, said respective semiconductor die having first and second opposite surfaces thermally connected to said top and bottom metallic surfaces and electrically insulated therefrom;
each of said plurality of packages having an inner surface of said bottom wafer assembly, said inner surface having a plurality of dimples formed thereon, said plurality of dimples extending through said inner surface and configured to act as solder stops and to self-align each said respective semiconductor die;
each said package including a plurality of terminals extending from an end surface thereof, and said end surface comprising an insulation housing overmolded around side edges of said top and bottom metallic surfaces;
a thermally conductive clip supporting said plurality of packages in a spaced parallel relationship, said top and bottom metallic surfaces of adjacent ones of said plurality of packages being spaced by a given space and being coextensive with respect to one another.

17. The power module assembly of claim 16, wherein said thermally conductive clip comprises connected modular plate-like elements.

18. The power module assembly of claim 16, wherein said thermally conductive clip comprises fingers connected by a common portion, said fingers disposed between adjacent ones of said packages and in thermal contact with said top and bottom surfaces of said packages.

19. The power module assembly of claim 18, wherein said common portion of said thermally conductive clip is parallel to said end surface.

20. The power module assembly of claim 18, wherein said fingers and said common portion are elongated permitting at least two packages to be received between adjacent fingers.

* * * * *